United States Patent
Wang et al.

(10) Patent No.: US 12,356,143 B2
(45) Date of Patent: Jul. 8, 2025

(54) METHODS FOR OPTIMIZING WORKING STATE OF BONE CONDUCTION EARPHONES

(71) Applicant: SHENZHEN SHOKZ CO., LTD., Guangdong (CN)

(72) Inventors: Zhen Wang, Shenzhen (CN); Lei Zhang, Shenzhen (CN)

(73) Assignee: SHENZHEN SHOKZ CO., LTD., Shenzhen (CN)

(*) Notice: Subject to any disclaimer, the term of this patent is extended or adjusted under 35 U.S.C. 154(b) by 261 days.

(21) Appl. No.: 18/164,673

(22) Filed: Feb. 6, 2023

(65) Prior Publication Data

US 2023/0188886 A1 Jun. 15, 2023

Related U.S. Application Data

(63) Continuation of application No. PCT/CN2021/082493, filed on Mar. 23, 2021.

(30) Foreign Application Priority Data

Jan. 11, 2021 (CN) .......................... 202110033059.0

(51) Int. Cl.
*H04R 1/10* (2006.01)
*G08B 6/00* (2006.01)
(Continued)

(52) U.S. Cl.
CPC .............. *H04R 1/288* (2013.01); *G08B 6/00* (2013.01); *H03G 5/165* (2013.01);
(Continued)

(58) Field of Classification Search
CPC .... H04R 1/288; H04R 1/1008; H04R 1/1041; H03G 5/165; G08B 6/00
See application file for complete search history.

(56) References Cited

U.S. PATENT DOCUMENTS

2013/0114837 A1* 5/2013 Pape .................... H04R 25/453
381/318
2014/0363002 A1* 12/2014 Kupershmidt ....... H04R 29/001
381/58
(Continued)

FOREIGN PATENT DOCUMENTS

CN 103644243 A 3/2014
CN 106686496 A 5/2017
(Continued)

OTHER PUBLICATIONS

The Extended European Search Report in European Application No. 21916956.2 mailed on Feb. 5, 2024, 7 pages.
(Continued)

*Primary Examiner* — Simon King
(74) *Attorney, Agent, or Firm* — METIS IP LLC

(57) ABSTRACT

The present disclosure is a method for optimizing a working state of a bone conduction earphone. The bone conduction earphone includes an earphone core and at least one vibration sensor. The method includes: obtaining a vibration signal through the at least one vibration sensor, the vibration signal being at least partially derived from vibration generated by the earphone core in response to an audio signal, and the vibration of the earphone core being transmitted to a user wearing the bone conduction earphone through bone conduction; determining a vibration response feature of the earphone core based on the vibration signal and the audio signal; and feeding back a working state of the bone conduction earphone based on the vibration response feature of the earphone core.

20 Claims, 14 Drawing Sheets

(51) Int. Cl.
  *H03G 5/16* (2006.01)
  *H04R 1/28* (2006.01)

(52) U.S. Cl.
  CPC ......... *H04R 1/1008* (2013.01); *H04R 1/1041* (2013.01); *H04R 1/105* (2013.01); *H04R 1/1091* (2013.01); *H04R 2460/13* (2013.01)

(56) References Cited

U.S. PATENT DOCUMENTS

| | | | |
|---|---|---|---|
| 2014/0363033 A1 | 12/2014 | Heiman et al. | |
| 2016/0123423 A1 | 5/2016 | Iwaki | |
| 2016/0320233 A1 | 11/2016 | Inagaki | |
| 2019/0387327 A1* | 12/2019 | Kukla | G08B 21/0446 |
| 2020/0382855 A1 | 12/2020 | Kitamura | |
| 2021/0256979 A1 | 8/2021 | Zhang et al. | |
| 2022/0060081 A1 | 2/2022 | Morisaki et al. | |
| 2022/0360883 A1* | 11/2022 | Tie | H04R 3/005 |

FOREIGN PATENT DOCUMENTS

| | | |
|---|---|---|
| CN | 106850963 A | 6/2017 |
| CN | 111541972 A | 8/2020 |
| CN | 112013949 A | 12/2020 |
| EP | 3324652 B1 | 5/2018 |
| RU | 2353083 C1 | 4/2009 |

OTHER PUBLICATIONS

International Search Report in PCT/CN2021/082493 mailed on Oct. 15, 2021, 6 pages.
Written Opinion in PCT/CN2021/082493 mailed on Oct. 15, 2021, 5 pages.
Flottorp, Gordon et al., Mechanical Impedance of Human Headbones (Forehead and Mastoid Portion of the Temporal Bone) Measured Under ISO/IEC Conditions, The Journal of the Acoustical Society of America, 59(4):899-906, 1976.
Notification to Grant Patent Right for Invention in Russian Application No. 2023104013 mailed on Jul. 18, 2023, 30 pages.
The Second Office Action in Chinese Application No. 202110309633.0 mailed on Feb. 28, 2025, 15 pages.
Notice of Allowance in Japanese Application No. 2023-518841 mailed on Nov. 11, 2024, 6 pages.

* cited by examiner

METHODS FOR OPTIMIZING WORKING STATE OF BONE CONDUCTION EARPHONES

CROSS-REFERENCE TO RELATED APPLICATION

This application is a continuation of International Application PCT/CN2021/082493, filed on Mar. 23, 2021, which claims priority of Chinese Patent Application No. 202110033059.0, filed on Jan. 11, 2021, the contents of which are entirely incorporated herein by reference.

TECHNICAL FIELD

The present disclosure relates to the field of acoustics, and in particular, to a method for optimizing a working state of a bone conduction earphone.

BACKGROUND

A bone conduction earphone is different from a traditional air conduction earphone. When a user wears the bone conduction earphone, an earphone core of the bone conduction earphone is attached to skin of the user's head, and vibration is directly transmitted to an ossicles of the user's middle ear or a cochlea of the inner ear through the user's bone, which allows the user to hear sound. However, in the process, the bone conduction earphone may have a negative impact on its functionality under different working conditions. For example, when the bone conduction earphone is in a working state of the user not well-wearing, that is, the earphone core is poorly attached to the skin of the user's head, the user may be unable to hear the sound through the bone conduction earphone or the quality of the sound may be poor, thereby reducing the user's hearing experience and wearing experience. It is important to determine a working state of the bone conduction earphone and make a corresponding feedback and optimization to ensure the functionality of the bone conduction earphone.

Therefore, it is necessary to provide a method for determining, feeding back and optimizing the working state of the bone conduction earphone to ensure the functionality of the bone conduction earphone so that the user may have a better hearing and wearing experience when using the bone conduction earphone.

SUMMARY

One of the embodiments of the present disclosure provides a method for optimizing a working state of a bone conduction earphone. The bone conduction earphone includes an earphone core and at least one vibration sensor. The method includes: obtaining a vibration signal by the at least one vibration sensor, the vibration signal being at least partially derived from vibration generated by the earphone core in response to an audio signal, and the vibration of the earphone core being transmitted to a user wearing the bone conduction earphone through bone conduction; determining a vibration response feature of the earphone core based on the vibration signal and the audio signal; and feeding back a working state of the bone conduction earphone based on the vibration response feature of the earphone core.

One of the embodiments of the present disclosure provides a bone conduction earphone, including an obtaining module, a determination module, and a control module. The obtaining module is configured to obtain the vibration signal through the at least one vibration sensor, the vibration signal is at least partially derived from the vibration generated by the earphone core in response to an audio signal, and the vibration of the earphone core is transmitted to a user wearing the bone conduction earphone through bone conduction. The determination module is configured to determine a vibration response feature of the earphone core based on the vibration signal and the audio signal. The control module is configured to feed back a working state of the bone conduction earphone based on the vibration response feature of the earphone core.

One of the embodiments of the present disclosure provides a method for training a recognition model, including: acquiring sample information; determining a sample type of each of the at least two user wearing records based on the sample information, the sample type including a positive sample type or a negative sample type; determining sample feature information corresponding to each of the at least two user wearing records based on the sample information; and determining the recognition model based on the sample feature information and the sample type of each of the at least two user wearing records.

BRIEF DESCRIPTION OF THE DRAWINGS

The present disclosure will be further illustrated by means of exemplary embodiments, which will be described in detail by means of the accompanying drawings. These embodiments are not restrictive, in which the same numbering indicates the same structure, wherein.

DETAILED DESCRIPTION

Figure 1:
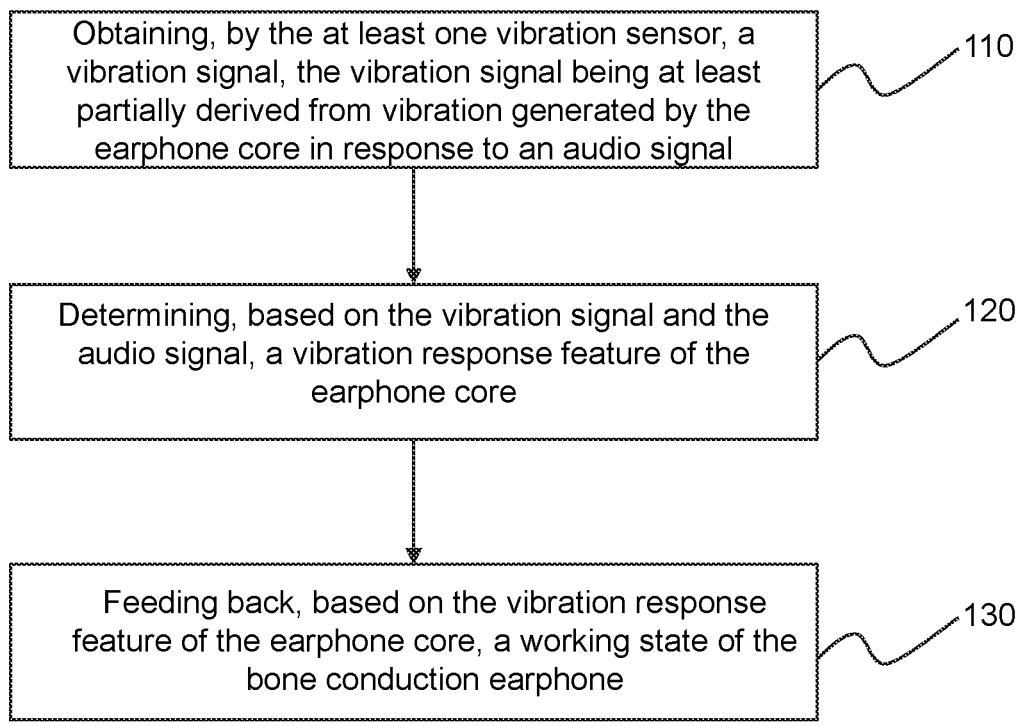
FIG. 1 is a flowchart illustrating a method for optimizing a working state of a bone conduction earphone according to some embodiments of the present disclosure.

To more clearly illustrate the technical solutions related to the embodiments of the present disclosure, a brief introduction of the drawings referred to the description of the embodiments is provided below. Obviously, the drawings described below are only some examples or embodiments of the present disclosure. Those skilled in the art, without further creative efforts, may apply the present disclosure to other similar scenarios according to these drawings. Unless obviously obtained from the context or the context illustrates otherwise, the same numeral in the drawings refers to the same structure or operation.

It should be understood that "system", "device", "unit", and/or "module" as used herein is a method for distinguishing different components, elements, components, parts, or assemblies of different levels. However, these words may be replaced by other expressions if other words can achieve the same purpose.

As indicated in this disclosure and claims, the terms "a", "an", and/or "the" do not refer to the singular and may include the plural unless the context clearly indicates an exception. Generally speaking, the terms "comprise", "comprises", "comprising", "include", "includes", and "including" only suggest the inclusion of clearly identified operations and elements, and these operations and elements do not constitute an exclusive list, and the method or device may also contain other operations or elements.

The flowcharts are used in the present disclosure to illustrate the operations performed by the system according to the embodiment of the present disclosure. It should be understood that the foregoing or following operations may not necessarily be performed exactly in order. Instead, various operations may be processed in reverse order or simultaneously. At the same time, other operations may be added to these processes, or a certain operation or operations may be removed from these processes.

When using a bone conduction earphone, different working states of the bone conduction earphone may affect functionality of the bone conduction earphone bone conduction earphone, resulting in poor hearing experience and wearing experience for a user. For example, when the user wears a bone conduction earphone, if the bone conduction earphone is not well-wearing, the sound quality heard by the user through the bone conduction earphone is poor. For another example, when the user wears the bone conduction earphone, and an initial input voltage of the bone conduction earphone is small or great, a volume of the sound heard by the user may be too low or too great, which may cause the user to have the poor hearing experience or may cause a hearing damage to the user. For another example, if a clamping force is too small or too great when the user wears the bone conduction earphone, it may affect a transmission efficiency of the bone conduction and the hearing experience or the wearing experience of the user. For another example, the bone conduction earphone may not automatically enter or exit the working state as the user wears or does not wear it, which may increase a power consumption of the bone conduction earphone and affect the user's wearing experience.

In view of the above problems, the present disclosure describes a method for optimizing the working state of the bone conduction earphone. By giving a feedback on the working state of the bone conduction earphone, the working state of the bone conduction earphones may be optimized, thereby ensuring that user has a better hearing experience and wearing experience. In some embodiments, the bone conduction earphone may include an earphone core and at least one vibration sensor, and the earphone core may generate vibration in response to an audio signal, and the vibration may be transmitted to the user wearing the bone conduction earphone through bone conduction. As skin of different positions of a human body has different loads, the vibration of the earphone core is related to an actual wearing position of the user. Here, the vibration signal may be obtained after the earphone core is coupled with the skin of the human body through the at least one vibration sensor. Furthermore, a vibration response feature of the earphone core may be determined based on the audio signal and the vibration signal, and the working state of the bone conduction earphone may be fed back to optimize the working state of the bone conduction earphone based on the vibration response feature of the earphone core. In some embodiments, a feeding back on the working state of the bone conduction earphone may include: when the user does not wear the bone conduction earphone, an instruction is generated to pause a play of the bone conduction earphone or adaptively adjust the power consumption of the bone conduction earphone to reduce the power consumption of the bone conduction earphone. In some embodiments, the feeding back on the working state of the bone conduction earphone may include: when the bone conduction earphone is not well-wearing, a prompt message is generated to remind the user to wear the bone conduction earphone again so that the sound quality heard by the user through the bone conduction earphone may be better, and thereby a better hearing experience may be achieved. In some embodiments, the feeding back on the working state of the bone conduction earphone may include: when the input voltage of the earphone core of the bone conduction earphone is too small or too great, an amplitude of the audio signal input to the earphone core may be adaptively adjusted, thereby ensuring that the user can hear the sound at an appropriate volume. In some embodiments, the feeding back on the working state of the bone conduction earphone may include: when the clamping force of the user wearing the bone conduction earphone is too small or too great, the clamping force of the user wearing the bone conduction earphone may be adaptively adjust, so as to ensure the transmission efficiency of bone conduction and guarantee a wearing comfort of the user. In some embodiments, the giving feedback on the working state of the bone conduction earphone may also include: when different users wear the bone conduction earphone or when the same user repeatedly wears the bone conduction earphone, an EQ compensation is performed on the audio signal input to the earphone core to ensure that different users or users with different wearing styles may hear the same sound effect through the bone conduction earphone. In some embodiments, a physiological state of the user may further be monitored by feeding back on the working state of the bone conduction earphone, so as to monitor and give feedback on the user's health condition.

FIG. 1 is a flowchart illustrating a method for optimizing a working state of a bone conduction earphone according to some embodiments of the present disclosure.

In some embodiments, the bone conduction earphone may include an earphone core and at least one vibration sensor. In the bone conduction earphone, the earphone core may be a transducer device that may convert a received audio signal into a mechanical vibration, and the mechanical vibration may be transmitted to the human ear through bone conduction, so that a user may hear a corresponding sound. In some embodiments, the earphone core may include, but is not limited to, an electric (coil) earphone core, a moving iron earphone core, a piezoelectric earphone core, a pneumatic earphone core, and an electrode earphone core, and the earphone core may generate the vibration in response to the audio signal. For example, the earphone core may be an electric earphone core, and its structure may include an electromagnet, a coil and a diaphragm. The coil is connected to the diaphragm, and the coil may drive the diaphragm to vibrate under drive of a signal current.

The vibration sensor may be a sensor that collects a frequency response curve of the vibration of the earphone core based on the vibration of the earphone core. In some embodiments, the at least one vibration sensor may be arranged inside or on the surface of the earphone core, and the vibration sensor may obtain the vibration signal based on the vibration of the earphone core, and then obtain the frequency response curve of the vibration of the earphone core based on the audio signal and the vibration signal, and the vibration response feature of the vibration of the earphone core may be determined through the frequency response curve. In some embodiments, the vibration response feature of the earphone core may include one or more of a resonant frequency of the earphone core, a response peak at a specific frequency, a quality factor, and an input voltage. In some embodiments, the vibration sensor may be clarified according to a parameter measured by the vibration sensor, and the vibration sensor may include a displacement sensor, a speed sensor, an acceleration sensor, etc. or any combination thereof. Different types of sensors may be applied to vibration collection of different frequency bands of the earphone core. For example, when the vibration sensor is a displacement sensor, it may be used to collect low frequency vibration of the earphone core. For another example, when the vibration sensor is a speed sensor, it may be used to collect medium frequency vibration of the earphone core. For another example, when the vibration sensor is an acceleration sensor, it may be used to collect high frequency vibration of the earphone core. In some embodiments, the bone conduction earphone may further include at least one vibration sensor for obtaining the vibration signal of various frequency bands (e.g., the low frequency, the medium frequency, the high frequency, etc.), so as to monitor the vibration signal of all frequency bands. In some embodiments, the vibration sensors may be classified according to whether there is an external excitation, and the vibration sensor may include an active sensor (needing external voltage or current excitation), and a passive sensor. In some embodiments, the vibration sensor may be classified according to a measured vibration direction, and the vibration sensor may include but not limited to a single-axis sensor, a multi-axis sensor, a rotary angular velocity sensor, etc. Different types of sensors may measure different vibration direction. For example, a single-axis sensor may measure a single-axis vibration direction. The multi-axis sensor and the rotary angular velocity sensor may measure a multi-axis vibration direction. In some embodiments, the vibration sensor may include but not limited to a piezoelectric sensor, an Integrated Circuits Piezoelectric (ICP) acceleration sensor, a Microelectro Mechanical System (MEMS) sensor, etc.

As shown in FIG. 1, a method 100 for optimizing the working state of the bone conduction earphone may include the following operations.

In operation 110, obtaining a vibration signal through at least one vibration sensor.

In some embodiments, the operation 110 may be performed by an obtaining module (e.g., an obtaining module 1410) of the bone conduction earphone. In some embodiments, the vibration signal is at least partially derived from the vibration of the earphone core in response to the audio signal. Specifically, the earphone core may convert the received audio signal into the mechanical vibration, and the mechanical vibration is transmitted to the user wearing the bone conduction earphone through bone conduction, so that the user may hear the corresponding sound, and the mechanical vibration may be transmitted to the vibration sensor inside or on the surface of the earphone core, the vibration sensor may obtain the corresponding vibration signal based on the mechanical vibration, and the frequency response curve of the vibration of the earphone core may be obtained based on the audio signal and the vibration signal, and the vibration response feature of the earphone core may be determined through the frequency response curve. In some embodiments, the audio signal may include an optical signal, an electrical signal, a magnetic signal, a mechanical signal, etc. with sound information. In some embodiments, the earphone core may receive the audio signal through a wired or wireless connection, and the audio signal may come from a storage unit of the bone conduction earphone, or a terminal device other than the bone conduction earphone (e.g., a mobile phone, a computer, an MP3, etc.). In some embodiments, the audio signal may be a preset audio calibration signal. For example, the audio calibration signal may be a sweep signal, a white noise signal, or a sound signal corresponding to a piece of music. In some embodiments, the audio signal may be the sound signal played when the user wears the bone conduction earphone.

In operation 120, determining, based on the vibration signal and the audio signal, a vibration response feature of the earphone core.

In some embodiments, the operation 120 may be performed by a determination module (e.g., a determination module 1420) of the bone conduction earphone. In some embodiments, after the vibration sensor obtains the vibration signal based on the vibration of the earphone core (also referred to as the mechanical vibration), the frequency response curve of the vibration of the earphone core may be obtained based on the vibration signal and the audio signal. According to the frequency response curve of the earphone core, the vibration response feature of the earphone core may be determined. In some embodiments, the vibration response feature of the earphone core may be extracted from the frequency response curve of the vibration of the earphone core through a feature extraction mode. In some embodiments, the mode for extracting the vibration response feature may include but not limited to a principal component analysis (PCA), an independent component analysis (ICA), a linear discriminant analysis (LDA), a Singular Value Decomposition (SVD), etc. In some embodiments, the vibration response feature of the earphone core may at least include one of a resonant frequency of the earphone core, a response peak of a specific frequency, a quality factor, and an input voltage. Further, the resonant frequency of the earphone core, the response peak of a specific frequency, the quality factor, or the parameter value (e.g., a vibration amplitude, a velocity, an acceleration, etc.) used to represent the input voltage of the earphone core, the like, or any combination thereof may be determined from the frequency response curve of the vibration of the earphone core.

In operation 130, feeding back, based on the vibration response feature of the earphone core, a working state of the bone conduction earphone.

In some embodiments, an operation 130 may be performed by the control module (e.g., the control module 1430) of the bone conduction earphone. In some embodiments, different working states of the bone conduction earphone may affect the vibration of the earphone core, so that the earphone core has different vibration response features. Therefore, the vibration response feature of the earphone core may be used to determine the working state of the bone conduction earphone, thereby feeding back the working state of the bone conduction earphone to optimize the working state of the bone conduction earphone, so as to ensure the hearing experience and wearing experience of the user when wearing the bone conduction earphone. In some embodiments, the feeding back the working state of the bone conduction earphone based on the vibration response feature of the earphone core may be implemented through an algorithm. It should be noted that in some embodiments, the different working states of the bone conduction earphone may be determined based on a certain time interval (e.g., 1 s, 2 s, 3 s, etc.). In some embodiments, the working state of the bone conduction earphone may be determined within a certain time range (e.g., 3 s, 4 s, 5 s, etc.) when the power of the bone conduction earphone is turned on.

In some embodiments, the working state of the bone conduction earphone may include a user wearing state and a user not wearing state. The feeding back, based on the vibration response feature of the earphone core, a working state of the bone conduction earphone may include determining, based on the vibration response feature of the earphone core, whether the working state of the bone conduction earphone is a user not wearing state. In response to a determination that the working state is the user not wearing state, an instruction is generated to pause the work of the bone conduction earphone or adjust power consumption of the bone conduction earphone to reduce the power consumption of the bone conduction earphone. In response to the determination that the working state of the bone conduction earphone is the user wearing state, the bone conduction earphone may continue to maintain the working state or further determine other working states of the bone conduction earphone (e.g., a user well-wearing state/a user not well-wearing state, the clamping force is too great or too small, etc.). The working state of the bone conduction earphone includes the user wearing state and the user not wearing state, and more contents of the feeding back the working state of the bone conduction earphone may be found in FIG. 2 and the related descriptions thereof.

In some embodiments, the working state of the bone conduction earphone may include a user well-wearing state and a user not well-wearing state. The feeding back, based on the vibration response feature of the earphone core, a working state of the bone conduction earphone may include determining whether the working state of the bone conduction earphone is the user not well-wearing state based on the vibration response feature of the earphone core. In response to the determination that the working state of the bone conduction earphone is the user not well-wearing state, the bone conduction earphone may generate prompt message to remind the user to wear the bone conduction earphone again or adjust the wearing posture and position of the bone conduction earphone, so as to ensure the user's hearing experience and wearing experience. In response to the determination that the working state of the bone conduction earphone is the user well-wearing state, the bone conduction earphone continues to maintain the well-wearing working state. For more contents on the working state of the bone conduction earphone including the user well-wearing state and the user not well-wearing state, and the feeding back the working state of the bone conduction earphone, please refer to FIG. 4 and the related descriptions thereof.

In some embodiments, the working state of the bone conduction earphone may be related to the clamping force when the user wears the bone conduction earphone. The feeding back, based on the vibration response feature of the earphone core, a working state of the bone conduction earphone may include determining whether the clamping force of the user when wearing the bone conduction earphone is within the preset range based on the vibration response feature of the earphone core. In response to the determination that the clamping force is not within the preset range, an instruction may be generated to adjust the corresponding structure of the bone conduction earphones to change the clamping force when the user wears the bone conduction earphone, so that the clamping force is within the preset range. As a result, a poor sound quality of the sound heard by the user through the bone conduction earphone due to too small clamping force or a discomfort to the user due to excessive clamping force may be avoided, so as to ensure the user's hearing experience and wearing experience. The working state of the bone conduction earphone is related to the clamping force when the user wears the bone conduction earphone. For more contents of feeding back on the working state of the bone conduction earphone, please refer to FIG. 6 and the related descriptions thereof.

In some embodiments, the working state of the bone conduction earphone may include the input voltage of the earphone core. The feeding back, based on the vibration response feature of the earphone core, a working state of the bone conduction earphone may include obtaining a parameter value indicating the input voltage of the earphone core, and determining whether the parameter value is within a voltage threshold. In response to the determination that the input voltage of the earphone core is not within the voltage threshold, an amplitude of the audio signal input to the earphone core is adjusted, so that the amplitude of the audio signal of the earphone core may not be too small resulting in the poor sound quality or a low volume when the user hears the sound through the bone conduction earphone, and the amplitude of the audio signal may not be too great resulting in a damage to the earphone core or causing a discomfort to the user or even damaging the user's hearing, so as to ensure the user's hearing experience and wearing experience. For more descriptions about the working state of the bone conduction earphone including the input voltage and the feeding back the working state of the bone conduction earphone, please refer to FIG. 11 and its related descriptions thereof.

In some embodiments, the feeding back, based on the vibration response feature of the earphone core, a working state of the bone conduction earphone may include recognizing a difference between the vibration response feature of the earphone core and a target vibration response feature, and performing, based on the difference, an EQ adjustment on the audio signal input to the earphone core. More contents may be found in FIG. 10 and the related descriptions thereof.

In some embodiments, the feeding back, based on the vibration response feature of the earphone core, a working state of the bone conduction earphone may include obtaining, based on the vibration response feature of the earphone core, a parameter value related to a physiological parameter of the user, and opening or closing, based on the parameter value, an auxiliary module of the bone conduction earphone. More contents can be found in FIG. 12 and its related descriptions thereof.

In some embodiments, the working state of the bone conduction earphone may include a user wearing state and a user not wearing state. The user wearing state refers to the working state of the bone conduction earphone after being worn by the user, which may further be understood that the earphone core of the bone conduction earphone fits the skin of the user's head. The user not wearing state refers to the state of the bone conduction earphone being not worn by the user, which may be understood that the bone conduction earphone does not fit the skin of the user's head.

Figure 2:
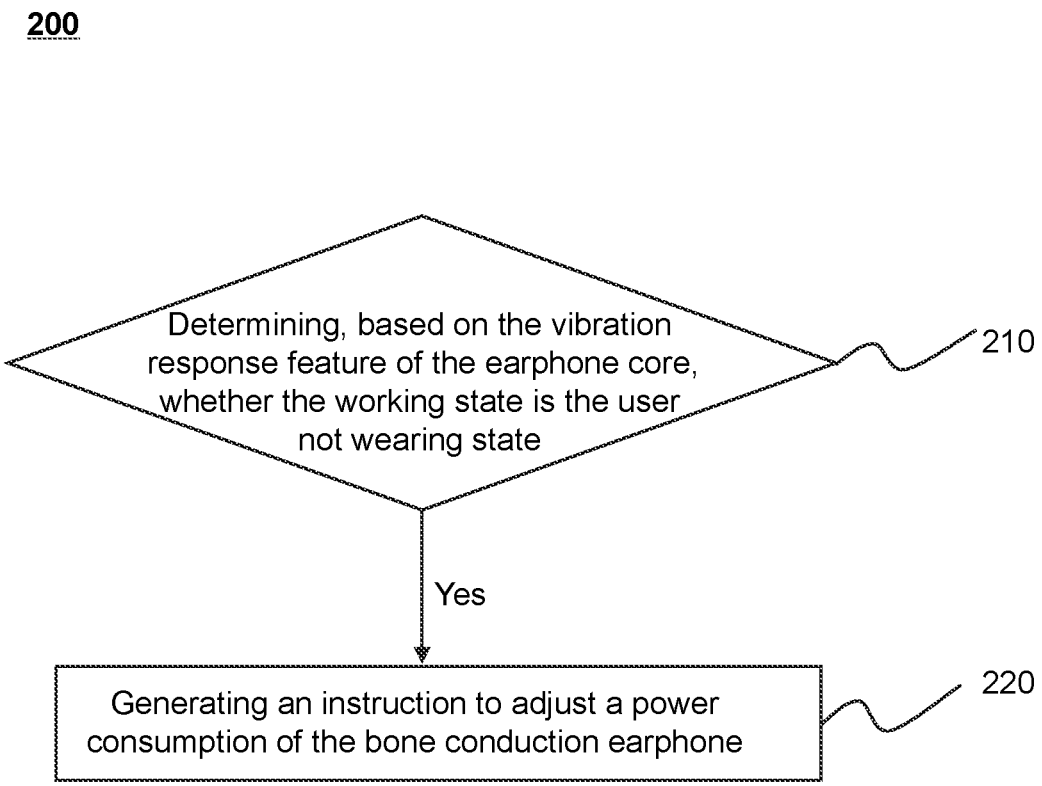
FIG. 2 is a flowchart illustrating a method for feeding back the working state of the bone conduction earphone according to some embodiments of the present disclosure.

FIG. 2 is a flowchart illustrating a method for feeding back the working state of the bone conduction earphone according to some embodiments of the present disclosure. When it is determined that the working state of the bone conduction earphone is a user wearing state or a user not wearing state, a method for feeding back the working state of the bone conduction earphone 200 based on a vibration response feature of an earphone core may include the following operations.

In operation 210, determining, based on the vibration response feature of the earphone core, whether the working state is the user not wearing state.

Figure 3:
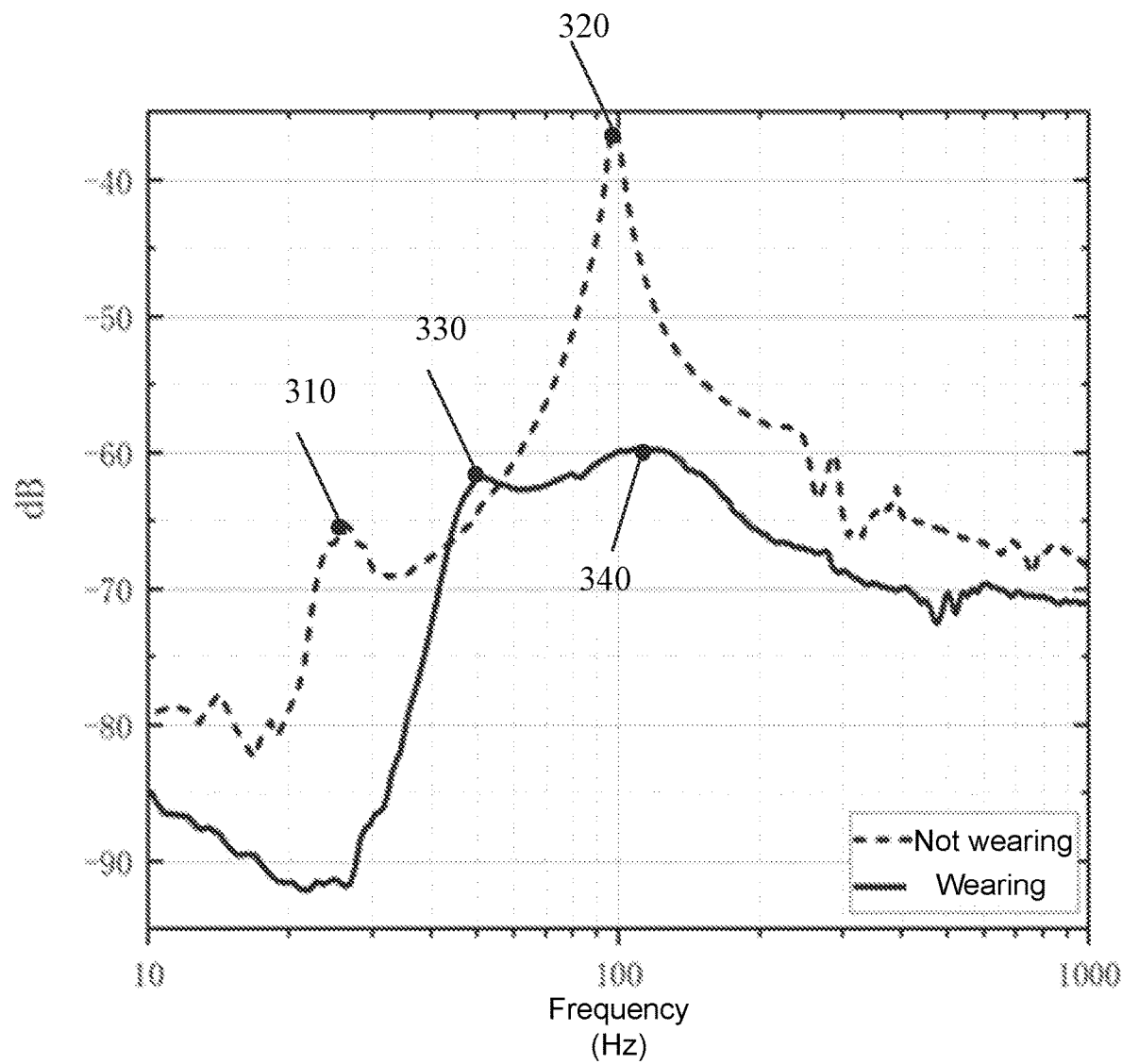
FIG. 3 is a frequency response curve illustrating vibration of an earphone core when the working state of the bone conduction earphone is a user wearing state and a user not wearing state according to some embodiments of the present disclosure.

In some embodiments, the operation 210 may be performed by a determination module (e.g., the determination module 1420) of the bone conduction earphone. In some embodiments, when the working state of the bone conduction earphone is the user wearing state, the earphone core is in contact with the user's skin, and a mechanical impedance of the skin may affect the vibration of the earphone core, while when the working state of the bone conduction earphone is the user not wearing state, the earphone core is not in contact with the user's skin, and the vibration of the earphone core may not be affected by the mechanical impedance of the skin. Therefore, the vibration signals collected by the vibration sensor are different when the working state of the bone conduction earphone is the user wearing state or the user not wearing state, so that the earphone core has different vibration response feature (e.g., the resonance frequency, the response peak value of the specific frequency, the quality factor, etc.). It may be determined that the working state of the bone conduction earphone is the user wearing state or the user not wearing state based on the vibration response feature of the earphone core. To further illustrate the bone conduction earphone in the user wearing state and the user not wearing state, the following further describes in combination with FIG. 3. FIG. 3 is a frequency response curve illustrating vibration of an earphone core when the working states of the bone conduction earphone are a user wearing state and a user not wearing state according to some embodiments of the present disclosure. A solid line in FIG. 3 is the frequency response curve of the vibration of the earphone core when the working state of the bone conduction earphone is the user wearing state, and a dotted line in FIG. 3 is the frequency response curve of the vibration of the earphone core when the working state of the bone conduction earphone is the user not wearing state. As shown in FIG. 3, when the working state of the bone conduction earphone is the user wearing state and the user not wearing state, the frequency response curve of the vibration of the earphone core is obviously different, and the vibration response feature of the earphone core also varies. For example, the frequency response curve of the vibration of the earphone core is flatter when the working state of the bone conduction earphone is the user wearing state compared with that when the working state of the bone conduction earphone is the user not wearing state. For another example, when the working state of the bone conduction earphone is the user wearing state, the frequency corresponding to the peak value of the frequency response curve of the vibration of the earphone core is smaller than that of the frequency response curve of the vibration of the earphone core when the working state of the bone conduction earphone is the user not wearing state. Specifically, when the working state of the bone conduction earphone is the user not wearing state, the frequency response curve of the earphone core has a corresponding response peak value 310 when the frequency is about 26 Hz, and has a corresponding response peak value 320 when the frequency is about 100 Hz. The response peak value 310 is about −65 dB, and the response peak value 320 is about −35 dB. When the working state of the bone conduction earphone is the user wearing state, the frequency response curve of the earphone core has a corresponding response peak value 330 when a frequency is about 56 Hz, and has a corresponding response peak value 340 when a frequency is about 120 Hz. The response peak value 330 is about −62 dB, and the response peak value 340 is about −60 dB.

In operation 220, in response to the determination that the working state is the user not wearing state, generating an instruction to adjust a power consumption of the bone conduction earphone.

In some embodiments, the operation 220 may be performed by a control module (e.g., the control module 1430) of the bone conduction earphone. In some embodiments, the bone conduction earphone may include a feedback circuit, and the control module (e.g., the control module 1430) of the bone conduction earphone may generate a corresponding instruction in response to the working state of the user not wearing state to control the feedback circuit to adjust the power consumption of the bone conduction earphone. In some embodiments, the adjusting the power consumption of the bone conduction earphone may be implemented by pausing play of the bone conduction earphone. For example, the instruction generated by the control module may control the feedback circuit to pause receiving of the audio signal of the earphone core of the bone conduction earphone or stop a terminal device transmitting the audio signal to the earphone core of the bone conduction earphone, or cut off the power or close part of the power consumption function of the bone conduction earphone. By feeding back on the working state of the bone conduction earphone as the user not wearing state, and generating the instruction to adjust the power consumption of the bone conduction earphone, the power consumption of the bone conduction earphone may be reduced and the battery life of the bone conduction earphone may be extended.

In some embodiments, it may also be determined whether the working state of the bone conduction earphone is the user not wearing state through a recognition model. Specifically, the vibration response feature of the earphone core may be input to the recognition model, and then a determination result may be generated based on the output of the recognition model. The determination result may include that the working state of the bone conduction earphone is the user wearing state and the working state of the bone conduction earphone is the user not wearing state. In some embodiments, the recognition model may be a trained machine learning model. In some embodiments, the machine learning model may include a K-Nearest Neighbor (KNN) model, a Bayesian model, a decision tree model, a random forest model, a logistic regression model, a neural network (NN) model, an ensemble learning model, the like, or any combination thereof.

In some embodiments, the above recognition model may be obtained through the following training mode: taking a predetermined working state of the bone conduction earphone being the user wearing state and the vibration response feature of the corresponding earphone core as a training positive sample; taking a predetermined working state of the bone conduction earphone being the user not wearing state and the vibration response feature of the corresponding earphone core as a training negative sample, and training the training positive sample and the negative sample respectively using the machine learning model to obtain the recognition model that is able to determine whether the working state of the earphone is the user not wearing state.

In some embodiments, the vibration response feature of the earphone core may be extracted through an algorithm (e.g., the mode of extracting the vibration response feature in the operation 120) and the vibration response feature may be compared with a preset vibration response feature to determine whether the working state of the bone conduction earphone is the user not wearing state. The preset vibration response feature may be the vibration response feature when the working state of the bone conduction earphone is the user wearing state (e.g., the resonant frequency, the response peak value of a specific frequency, the quality factor, etc.). If there is a difference between the vibration response feature of the earphone core and the preset vibration response feature, or the difference is not within a certain threshold, it may be determined that the corresponding working state is the user not wearing state.

In some embodiments, if the working state is the user wearing state, the bone conduction earphone works normally, or it may be further determined whether the working state of the bone conduction earphone is a user not well-wearing state, so as to feed back on the working state of the user not well-wearing state, and then optimize the working state.

Figure 4:
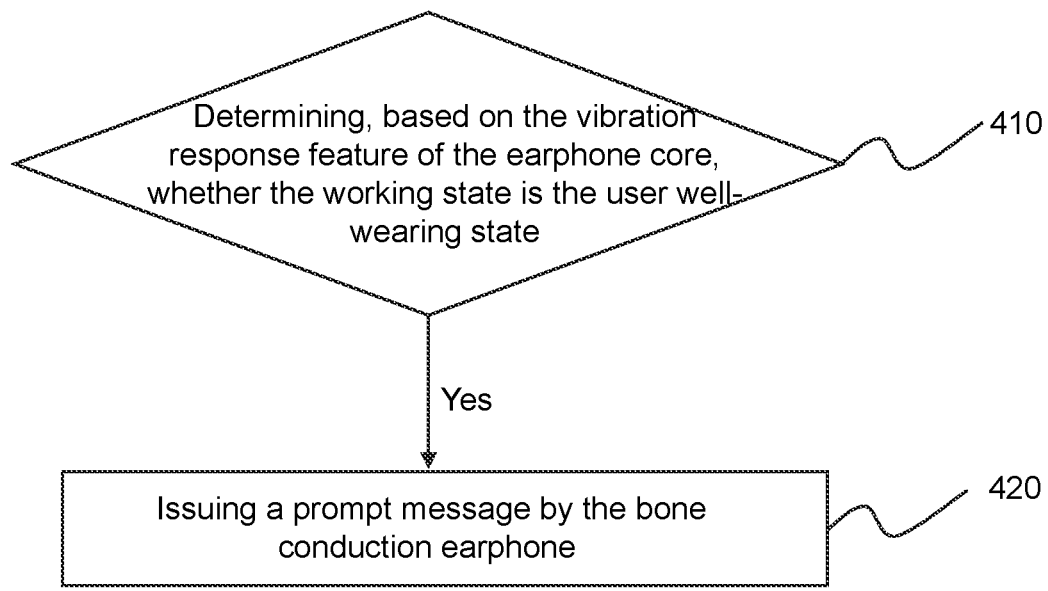
FIG. 4 is a flowchart illustrating a method for feeding back the working state of the bone conduction earphone according to some embodiments of the present disclosure.

In some embodiments, the working state of the bone conduction earphone may further include the user well-wearing state and the user not well-wearing state. The user well-wearing state refers to a working state in which the bone conduction earphone is correctly worn by the user. For example, a vibration output end of the earphone core of the bone conduction earphone is completely attached to the user's skin. For another example, the earphone core of the bone conduction earphone is located in a specific area of the user's skin (e.g., the earphone core is located in a front area of the user's auricle). The user not well-wearing state refers to a working state in which the bone conduction earphone is not corrected worn by the user. For example, the earphone core of bone conduction earphone is only partially fitted to the skin of the user's head. For another example, the earphone core is located outside the specific area of the user's skin (e.g., behind the user's auricle). FIG. 4 is a flowchart illustrating a method for feeding back the working state of the bone conduction earphone according to some embodiments of the present disclosure. When it is used to determine that the working state of the bone conduction earphone is a user well-wearing state or a user not well-wearing state, a mode 400 for feeding back the working state of the bone conduction earphone based on a vibration response feature of an earphone core may include the following operations.

In operation 410: determining, based on the vibration response feature of the earphone core, whether the working state is the user well-wearing state. In some embodiments, the operation 410 may be performed by a determination module (e.g., the determination module 1420) of the bone conduction earphone.

Figure 5:
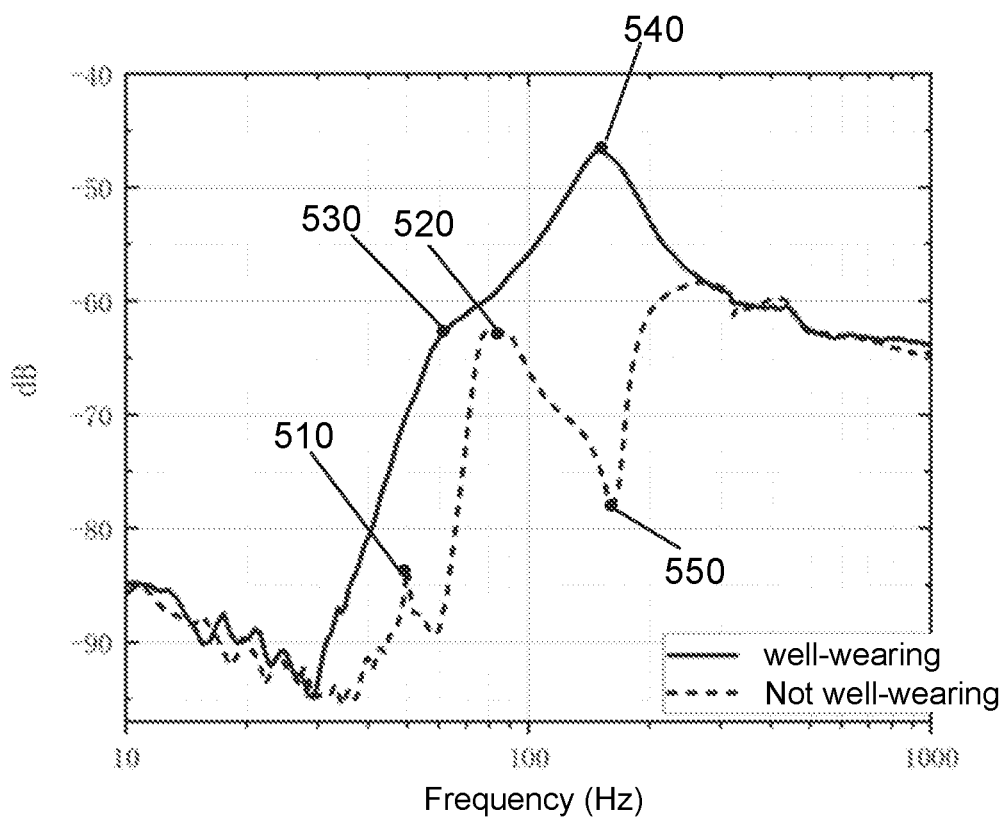
FIG. 5 is a frequency response curve illustrating the vibration of the earphone core when the working state of the bone conduction earphone is a user well-wearing state and a user not well-wearing state according to some embodiments of the present disclosure.

In some embodiments, when the working state of the bone conduction earphone is the user well-wearing state and the user not well-wearing state, the earphone core and skin of the user's head have different contact conditions, so that a mechanical impedance of the skin may have different impact on the vibration of the earphone core. Therefore, a vibration signal collected by a vibration sensor may be different when the working state of the bone conduction earphone is the user well-wearing state and the user not well-wearing state, so that the earphone core may have different vibration response feature (e.g., the resonant frequency, the response peak of a specific frequency, the quality factor, etc.) when the working state of the bone conduction earphone is the user well-wearing state and the user not well-wearing state. It may be determined that the working state of the bone conduction earphone is the user well-wearing state or the use not well-wearing state may be determined based on the vibration response feature of the earphone core. To further illustrate the bone conduction earphones in the user well-wearing state and the user not well-wearing state, the following further describes in combination with FIG. 5. FIG. 5 is the frequency response curve illustrating the vibration of the earphone core when the working state of the bone conduction earphone is a user well-wearing state and a user not well-wearing state according to some embodiments of the present disclosure. A solid line in FIG. 5 is the frequency response curve of the vibration of the earphone core when the working state of the bone conduction earphone is the user well-wearing state, and the dotted line in FIG. 5 is the frequency response curve of the vibration of the earphone core when the working state of the bone conduction earphone is the user not well-wearing state. As shown in FIG. 5, when the working state of the bone conduction earphone is the user not well-wearing state and the user well-wearing state, there is an obvious difference between the frequency response curves of the vibration of the earphone core, and the vibration response features of the vibration of the earphone core may be different as well. For example, the frequency response curve of the vibration of the earphone core when the working state of the bone conduction earphone is the user well-wearing state is flatter than that when the working state of the bone conduction earphone is the user not well-wearing state. For another example, the frequency corresponding to the peak value of the frequency response curve of the vibration of the earphone core when the working state of the bone conduction earphone is the user well-wearing state is smaller than that of the frequency response curve of the vibration of the earphone core when the working state of the bone conduction earphone is the user not well-wearing state. Specifically, when the working state of the bone conduction earphone is the user not well-wearing state, the frequency response curve of the earphone core has a corresponding response peak value 510 when the frequency is about 50 Hz, and a corresponding response peak value 520 when the frequency is about 80 Hz. The response peak value 510 is about −84 dB, and the response peak value 520 is about −63 dB. When the working state of the bone conduction earphone is the user well-wearing state, the frequency response curve of the earphone core has a corresponding response peak value 530 when a frequency is about 60 Hz, and a corresponding response peak value 540 when a frequency is about 160 Hz. The response peak value 530 is about −65 dB, and the response peak value 540 is about −45 dB. In addition, when the working state of the bone conduction earphone is the user not well-wearing state, for example, only part of the earphone core is in contact with the human skin, a trough 550 may appear in the frequency curve of the bone conduction earphone. In some embodiments, when one or more troughs (e.g., the trough 550) appear in the frequency response curve of the bone conduction earphone, it may further indicate that the user is not well-wearing the bone conduction earphone.

In operation 420, in response to a determination that the working state is the user not well-wearing state, issuing a prompt message by the bone conduction earphone.

In some embodiments, the operation 420 may be performed by a control module (e.g., the control module 1430) of the bone conduction earphone. In some embodiments, the control module may issue the prompt message, which may be received by the user, to remind the user to wear the bone conduction earphone again or adjust a posture or position, etc. of wearing the bone conduction earphone. In some embodiments, the bone conduction earphone may prompt the user by vibrating the earphone core or playing a voice prompt by the earphone core. In some embodiments, the bone conduction earphone may issue the prompt message to the user through a wired or wireless connected terminal device (e.g., a mobile phone, a computer, etc.), and form of the prompt message may include but not limited to a vibration, a text, an image, a voice, etc. By feeding back on the working state of the bone conduction earphone being the user not well-wearing state, the bone conduction earphone may send a prompt message to the user for prompting the user to wear the bone conduction earphone again or adjust the posture or position of wearing the bone conduction earphone, so as to avoid poor sound quality caused by the user's failure to wear the bone conduction earphone properly, thereby ensuring the hearing experience of the user. In some embodiments, in response to the determination that the working state of the bone conduction earphone is the user well-wearing state, the bone conduction earphone continues to work while maintaining the user well-wearing state.

In some embodiments, it may also be determined whether the working state of the bone conduction earphone is the user not well-wearing state through the recognition model. Specifically, the vibration response feature of the earphone core may be input to the recognition model, and then a determination result may be generated based on the output of the recognition model. The determination result may include that the working state of the bone conduction earphone is the user well-wearing state and the working state of the bone conduction earphone is the user not well-wearing state. In some embodiments, the recognition model may be a trained machine learning model. In some embodiments, the machine learning model may include a K-Nearest Neighbor (KNN) model, a Bayesian model, a decision tree model, a random forest model, a logistic regression model, a neural network (NN) model, an ensemble learning model, the like, or any combination thereof.

In some embodiments, the above recognition model may be obtained through the following training mode: taking a predetermined working state of the bone conduction earphone being the user well-wearing state and the vibration response feature of the corresponding earphone core as a training positive sample; taking a predetermined working state of the bone conduction earphone being the user not well-wearing state and the vibration response feature of the corresponding earphone core as a training negative sample, and training the training positive sample and the training negative sample respectively using the machine learning model to obtain the recognition model that is able to determine whether the working state of the earphone is the user not well-wearing state.

In some embodiments, the vibration response feature may be compared with a preset vibration response feature through an algorithm to determine whether the working state of the bone conduction earphone is the user not well-wearing state. The preset vibration response feature may be the vibration response feature when the working state of the bone conduction earphone is the user well-wearing state (e.g., the resonant frequency, the response peak value of a specific frequency, the quality factor, etc.). If there is a difference between the vibration response feature of the earphone core and the preset vibration response feature, or the difference is not within a certain threshold, it may be determined that the corresponding working state is the user not well-wearing state.

Figure 6:
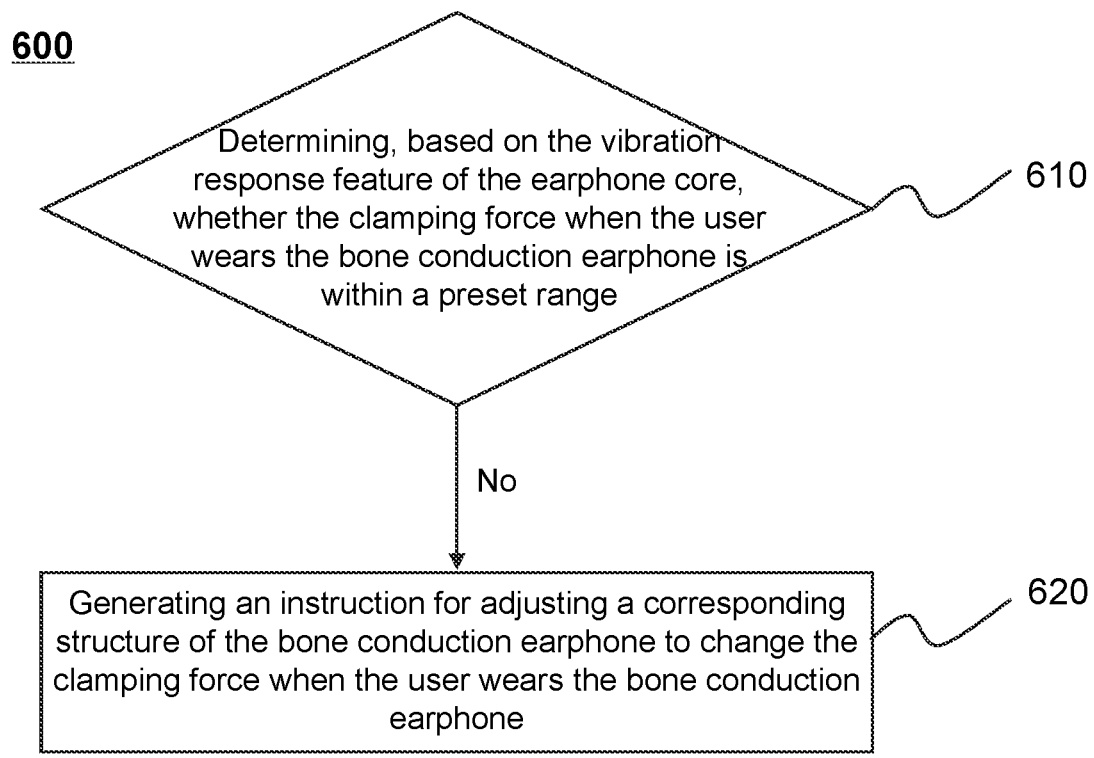
FIG. 6 is a flowchart illustrating a method for feeding back the working state of the bone conduction earphone according to some embodiments of the present disclosure.

In some embodiments, the feeding back on the working state of the bone conduction earphone may include adjusting a clamping force when the user wears the bone conduction earphone. Specifically, the working state of the bone conduction earphone may be related to the clamping force when the user wears the bone conduction earphone, and a size of the clamping force may affect the sound quality or volume of the sound heard by the user through the bone conduction earphone and the user's comfortability when wearing the bone conduction earphone. The clamping force when the user wears the bone conduction earphone may refer to a pressure of the earphone core on the user's skin. FIG. 6 is a flowchart illustrating a method for feeding back the working state of the bone conduction earphone according to some embodiments of the present disclosure. When the working state of the bone conduction earphone is related to a clamping force of the user wearing the bone conduction earphone, a method for feeding back the working state of the bone conduction earphone 600 based on a vibration response feature of the earphone core may include the following operations.

In operation 610: determining, based on the vibration response feature of the earphone core, whether the clamping force when the user wears the bone conduction earphone is within a preset range.

In some embodiments, the operation 610 may be performed by a determination module (e.g., the determination module 1420) of the bone conduction earphone. In some embodiments, as different clamping force of the user wearing the bone conduction earphone may cause different mechanical impedance of the skin, and the mechanical impedance of different skin may have different effect on the vibration of the earphone core. Therefore, when the user wears the bone conduction earphone, different clamping force may lead to different frequency response curve of the vibration of the earphone core collected by a vibration sensor, so that the different clamping force when the user wears the bone conduction earphone may correspond to different vibration response feature of the earphone core (e.g., the resonant frequency, the response peak of a specific frequency, the quality factor, etc.), and it may be determined whether the clamping force when the user wears the bone conduction earphone is within a preset range based on the vibration response feature of the earphone core. In some embodiments, the preset range may be 0.2 N~0.5 N. In some embodiments, the preset range may be 0.25 N~0.45 N. In some embodiments, the preset range may be 0.3 N~0.4 N. It should be noted that the preset range is not limited to the above range, and the preset range may be adaptively adjusted according to the experience of the user.

Figure 7:
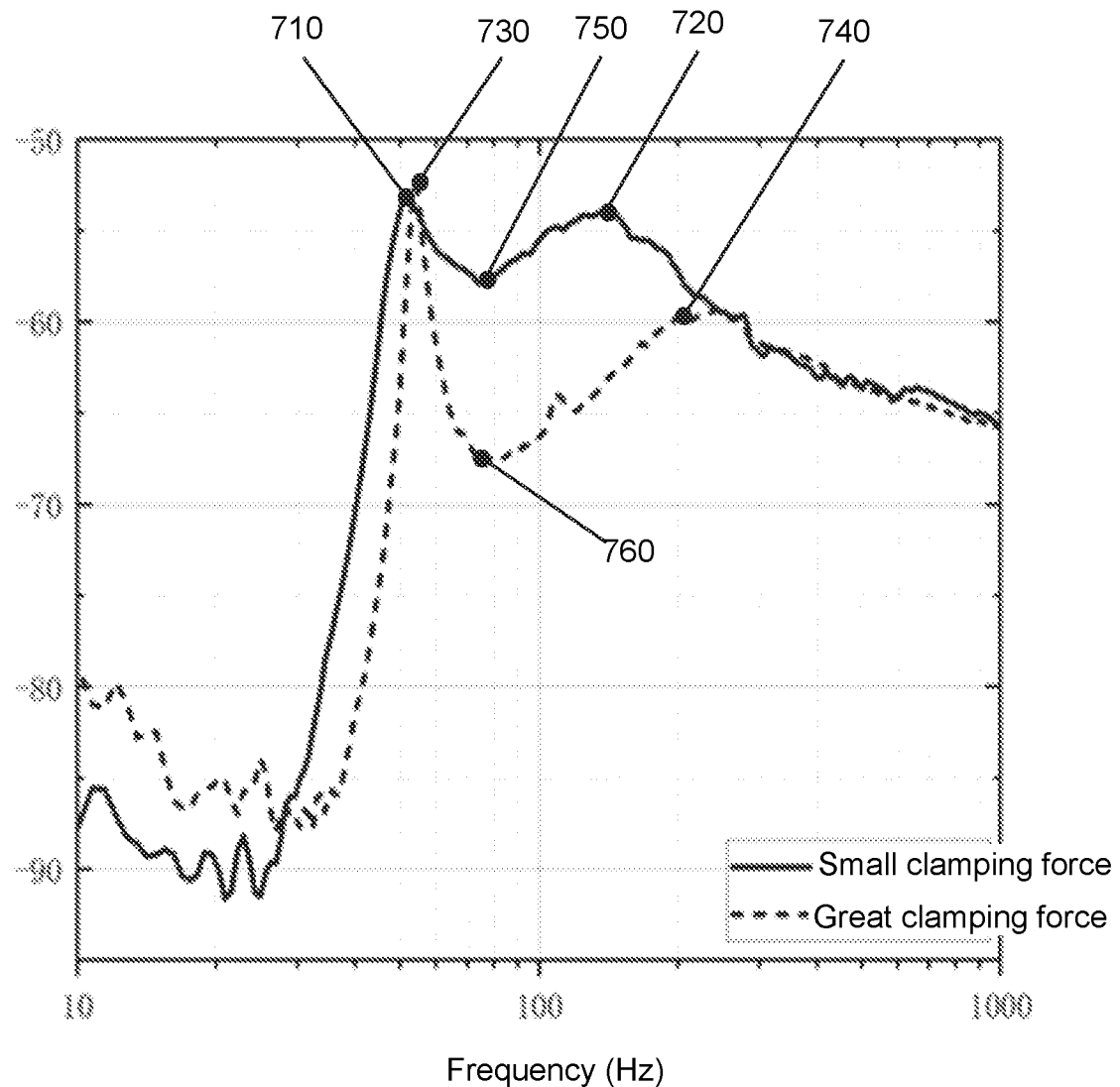
FIG. 7 is a frequency response curve illustrating the vibration of the earphone core corresponding to a greater clamping force and a smaller clamping force when the working state of the bone conduction earphone is the user wearing state according to some embodiments of the present disclosure.

To further illustrate the bone conduction earphone with different clamping force when the user wears the bone conduction earphone, the following further describes in combination with FIG. 7. FIG. 7 is the frequency response curve illustrating the vibration of the earphone core corresponding to a great clamping force and a small clamping force when the working state of the bone conduction earphone is a user wearing state according to some embodiments of the present disclosure. A solid line in FIG. 7 corresponds to the frequency response curve of the vibration of the earphone core corresponding to the small clamping force when the user wears the bone conduction earphone, and the dotted line in FIG. 7 corresponds to the frequency response curve of the vibration of the earphone core corresponding to the great clamping force when the user wears the bone conduction earphone. As shown in FIG. 7, there is an obvious difference between the frequency response curves of the vibration of the earphone core corresponding to the great clamping force when the user wears the bone conduction earphone and the small clamping force when the user wears the bone conduction earphone. The vibration response feature of the vibration of the earphone core corresponding to the great clamping force when the user wears the bone conduction earphone and the small clamping force when the user wears the bone conduction earphone may be also different. For example, when the user wears the bone conduction earphone with the great clamping force, the frequency response curve of the vibration of the earphone core is flatter than that when the user wears the bone conduction earphone with the small clamping force. For another example, when the user wears the bone conduction earphone with the small clamping force, the frequency corresponding to the peak value of the frequency response curve of the vibration of the earphone core is smaller than that of the frequency response curve of the vibration of the earphone core when the user wears the bone conduction earphone with the great clamping force. Specifically, when the user wears the bone conduction earphone with the small clamping force, the frequency response curve of the earphone core has a corresponding response peak value 710 when the frequency is about 45 Hz, and a corresponding response peak value 720 when the frequency is about 150 Hz. The response peak 710 is about −53 dB, and the response peak 720 is about −54 dB. When the user wears the bone conduction earphone with the great clamping force, the frequency response curve of the earphone core has a corresponding response peak value 730 when a frequency is about 50 Hz, and a corresponding response peak value 740 when a frequency is about 200 Hz. The response peak 730 is about −52 dB and the response peak 320 is about −60 dB. In some embodiments, combining with the frequency response curve of the vibration of the earphone core of the bone conduction earphone when the working state of the bone conduction earphone is the user well-wearing state in FIG. 5, it may be seen that the frequency response curve of the vibration of the earphone core when the working state is the user well-wearing state is flatter than that of the earphone core when the clamping force is small or great when the user wears the bone conduction earphone, while the corresponding frequency of the response peak value in the frequency response curve of the vibration of the earphone core when the working state is the user well-wearing state is greater than that in the frequency response curve of the vibration of the earphone core when the user wears the bone conduction earphone with the great or small clamping force. Furthermore, when the user wears the bone conduction earphone with the small or great clamping force, the frequency response curve of the vibration of the earphone core has a great trough (e.g., a trough 750, a trough 760), and the trough may further reflect that the clamping force of the bone conduction earphone is great or small when user wears the bone conduction earphone.

In operation 620, in response to the determination that the clamping force is not within the preset range, generating an instruction for adjusting a corresponding structure of the bone conduction earphone to change the clamping force when the user wears the bone conduction earphone.

In some embodiments, the operation 620 may be performed by a control module (e.g., the control module 1430) of the bone conduction earphone. In some embodiments, the bone conduction earphone may include a feedback circuit and a structure for adjusting the clamping force, and in response to that the clamping force is not within the preset range when the user wears the bone conduction earphone, the control module may generate the corresponding instruction to control the feedback circuit to adjust the structure of the bone conduction earphone, thereby changing the clamping force when the user wears the bone conduction earphone. In some embodiments, the control module may generate, based on a difference between the clamping force and the preset range, the corresponding instruction to control the feedback circuit to accurately adjust the structure of the bone conduction earphone for adjusting the clamping force, so that the clamping force is just within the preset range when the user wears the bone conduction earphone. In some embodiments, the feedback circuit may be controlled by an instruction generated by the control module to adjust a length or an opening angle of a rear hanger of the bone conduction earphone to adjust the clamping force when the user wears the bone conduction earphone. For example, when the clamping force is smaller than the preset range, the clamping force may be increased by increasing the length of the rear hanger or reducing the opening angle of the rear hanger. For another example, when the clamping force is greater than the preset range, the clamping force may be reduced by reducing the length of the rear hanger or increasing the opening angle of the rear hanger. In some embodiments, the bone conduction earphone may include a driving structure capable of changing the length and the opening angle of the bone conduction earphone based on the instruction generated by the feedback circuit. For example, the drive structure may include a micro motor and an adjustment assembly (e.g., a retractable rod structure) for adjusting the length or the opening angle of the rear hanger, an output end of the micro motor is connected to the adjustment assembly, and the micro motor may drive the adjustment assembly to increase or decrease the length and the opening angle of the driving assembly.

In some embodiments, it may also be determined whether the clamping force is within the preset range when the user wears the bone conduction earphone through the recognition model. Specifically, the vibration response feature of the earphone core may be input to a recognition model, a parameter value representing the clamping force when the user wears the bone conduction earphone may be obtained based on an output of the recognition model, and then it may be determined whether the parameter value is within the preset range. In some embodiments, the parameter value represents the clamping force when the user wears the bone conduction earphone may be a parameter that reflects size of the clamping force or a size range of the clamping force. In some embodiments, the recognition model may be a trained machine learning model. In some embodiments, the machine learning model may include a k-nearest neighbor (KNN) model, a Bayesian model, a decision tree model, a random forest model, a logistic regression model, a neural network (NN) model, an ensemble learning model, the like, or any combination thereof.

In some embodiments, the above recognition model may be obtained through the following training mode: collecting the vibration response feature of the earphone core corresponding to different clamping force when the user wears the bone conduction earphones in advance, and taking the collected vibration response feature of the plurality of earphone cores as input data, and taking specific size or the size range of the corresponding clamping force as output data to train the machine learning model to obtain the recognition model capable of obtaining the parameter value representing the clamping force when the user wears the bone conduction earphone based on the vibration response feature of the earphone core.

After obtaining the parameter value representing the clamping force when the user wears the bone conduction earphone through the recognition model, by comparing the parameter value with a preset range, it may be determined whether the parameter value is within the preset range. In some embodiments, the preset range may be a clamping force range to ensure that the user may comfortably wear the bone conduction earphone. In some embodiments, the preset range may be 0.25 N~0.45 N. In some embodiments, the preset range may be 0.3 N~0.4 N.

In some embodiments, an algorithm may be used to directly compare the vibration response feature of the earphone core with a preset vibration response feature to determine whether the clamping force when the user wears the bone conduction earphone exceeds the preset range. The preset vibration response feature may be the vibration response feature of the corresponding earphone core when the clamping force is within the preset range when the user wears the bone conduction earphone (e.g., the resonance frequency, the response peak of a specific frequency, the quality factor, etc.), if there is a difference between the vibration response feature of the earphone core and the preset vibration response feature, or the difference is not within a certain threshold, it may be determined whether the clamping force of the vibration response feature of the earphone core when the user wears the bone conduction earphone is within the preset range.

By determining whether the clamping force related to the working state of the bone conduction earphone is within the preset range, and feeding back on the corresponding working state (e.g., adjusting the clamping force), it may avoid that the clamping force is too small to affect the efficiency of bone conduction, which may lead to a poor sound quality or low volume of the sound heard by the user through the bone conduction earphone, and it may also avoid that the clamping force is too large to cause excessive pressure on the user's skin and bring discomfort to the user, thereby ensuring the user's hearing experience and wearing experience.

Figure 8:
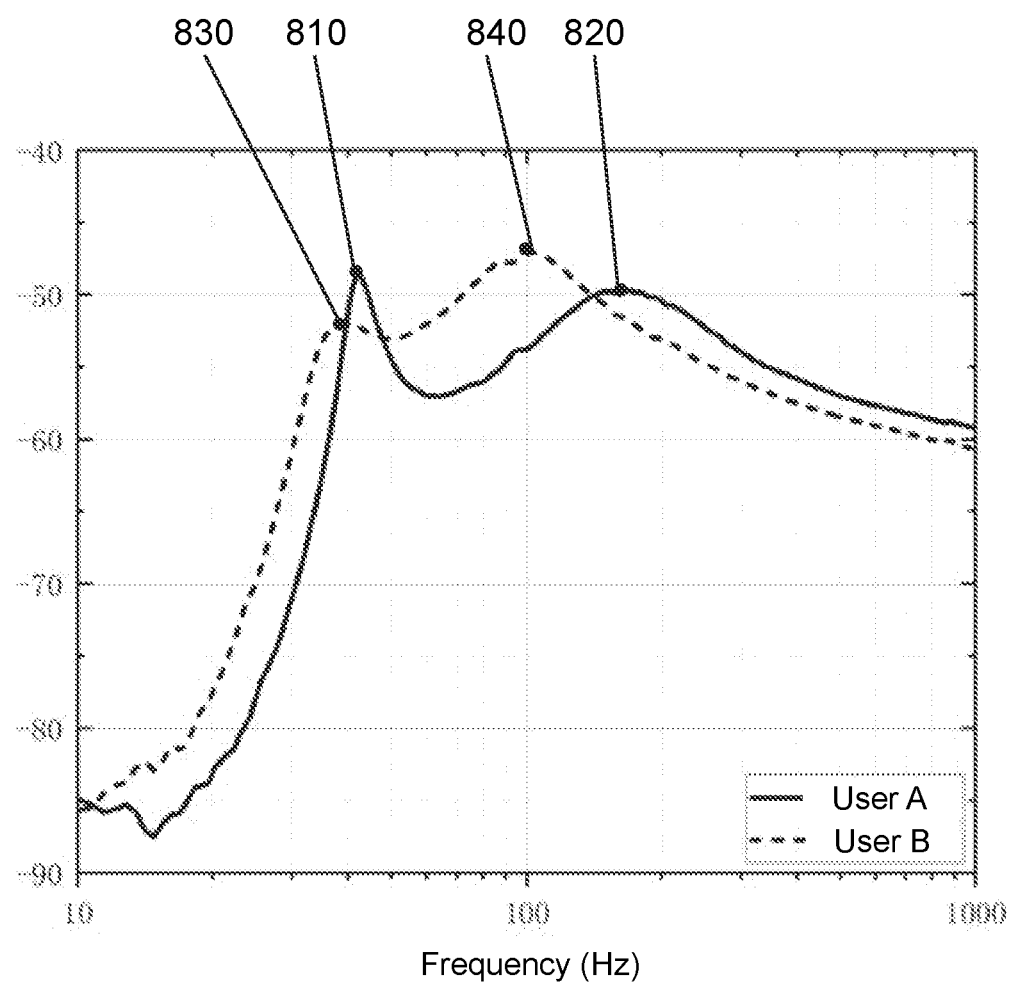
FIG. 8 is a frequency response curve illustrating the vibration of the earphone core when different user wears the same bone conduction earphone according to some embodiments of the present disclosure.

In some scenarios, due to different age and somatotype of different users, skin feature of the different users may be different, making the mechanical impedance of the skin inconsistent. When different user wears the same bone conduction earphone, the inconsistent mechanical impedance of the skin may have different impact on the vibration of the earphone core, resulting in different sound heard by different user wearing the same bone conduction earphone based on the same audio signal. To further illustrate the bone conduction earphone worn by different users, the following further describes in combination with FIG. 8. FIG. 8 is frequency response curve illustrating the vibration of the earphone core when different user wears the same bone conduction earphone according to some embodiments of the present disclosure. A solid line in FIG. 8 is the frequency response curve of the vibration of the earphone core when user A wears the bone conduction earphone, and the dotted line in FIG. 8 is the frequency response curve of the vibration of the earphone core when user B wears the bone conduction earphone. As shown in FIG. 8, when user A and user B wear the same bone conduction earphone, the frequency response curve of the vibration of the earphone core may be different, so that when user A and user B wear the same bone conduction earphone, the earphone core has different vibration response feature. Specifically, when user A wears the bone conduction earphone, the frequency response curve of the earphone core has a corresponding response peak 810 when the frequency is about 40 Hz, and a corresponding response peak value 820 when the frequency is about 180 Hz. The response peak value 810 is about −48 dB, and the response peak value 820 is about −50 dB. When user B wears the bone conduction earphone, the frequency response curve of the earphone core has a corresponding response peak value 830 when the frequency is about 42 Hz, and a corresponding response peak value 840 when the frequency is about 100 Hz. The response peak value 830 is about −52 dB, and the response peak value 840 is about −47 dB.

Figure 9:
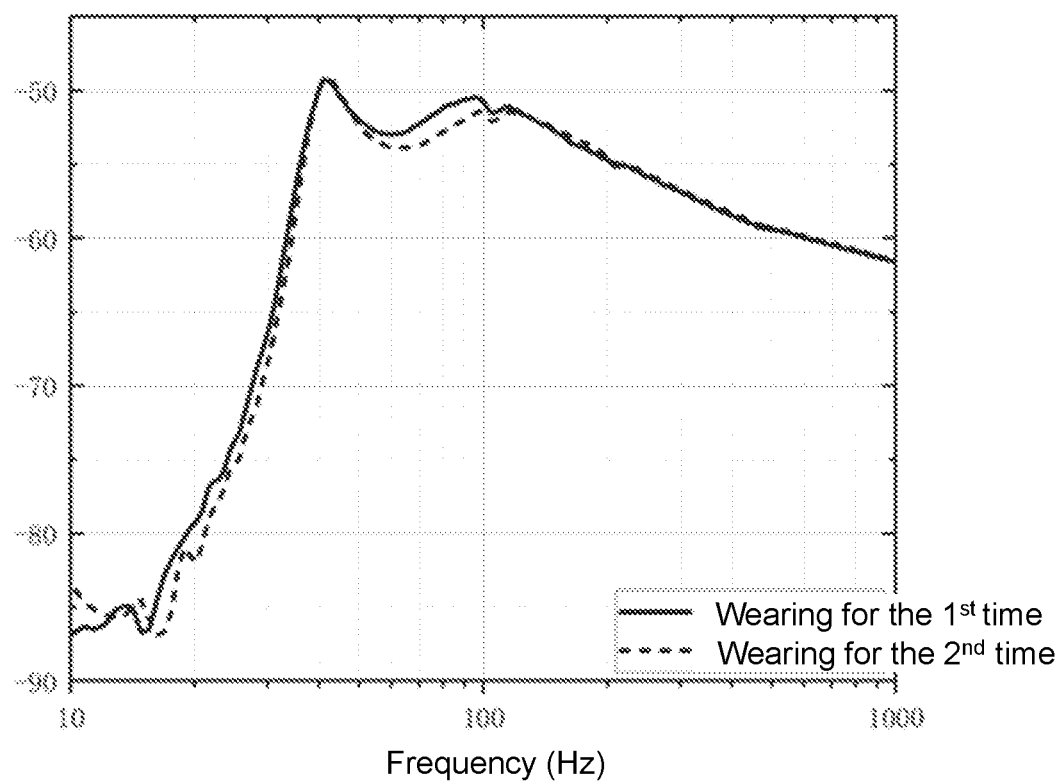
FIG. 9 is a frequency response curve illustrating the vibration of the earphone core when the same user wears the bone conduction earphone for multiple times according to some embodiments of the present disclosure.

In other scenarios, as the skin at different positions of the user has different mechanical impedance, and when the user repeatedly wears the bone conduction earphone, the position where the earphone core fitted to the skin changes, and the impact of the mechanical impedance of the skin at different positions on the vibration of the earphone core may be different, resulting in a difference based on the same audio signal when the same user repeatedly wears bone conduction earphone. To further illustrate the bone conduction earphone when the user repeatedly wears the bone conduction earphone, the following further describes in combination with FIG. 9. FIG. 9 is a frequency response curve illustrating the vibration of the earphone core when the same user wears the bone conduction earphone for multiple times according to some embodiments of the present disclosure. The solid line in FIG. 9 is the frequency response curve of the vibration of the earphone core when the user wears the bone conduction earphone for the first time, and the dotted line in FIG. 9 is the frequency response curve of the vibration of the earphone core when the user wears the bone conduction earphone for the second time. It may be seen from FIG. 9 that the frequency response curves of the vibration of the earphone core are different when the user wears the bone conduction earphone for the first time and when the user wears the bone conduction earphone for the second time, so that the earphone core may have different vibration response feature when the user wears the bone conduction earphone for the first time and the second time. For example, there is a difference between a vibration amplitude of the earphone core at the frequency of 60 Hz~100 Hz when the user wears the bone conduction earphone for the first time and for the second time. This difference may result in different sound (e.g., different sound effect) heard by the user when the user wears the bone conduction earphone for the first time and the second time.

Figure 10:
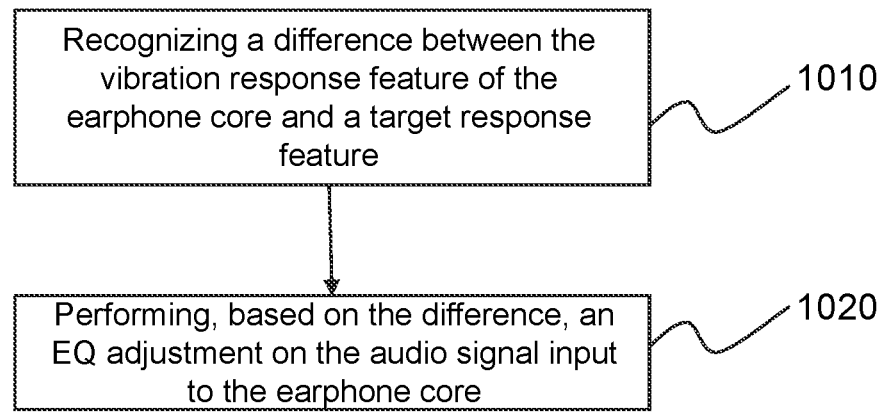
FIG. 10 is a flowchart illustrating the method for feeding back the working state of the bone conduction earphone according to some embodiments of the present disclosure.

To ensure that the sound heard by different users wearing the same bone conduction earphone or by the same user repeatedly wearing the same bone conduction earphone is consistent, feedback on a working state of the bone conduction earphone may be implemented based on the vibration response feature of the earphone core. FIG. 10 is a flowchart illustrating a method for feeding back the working state of the bone conduction earphone according to some embodiments of the present disclosure. When different user wears the same bone conduction earphone or the same user repeatedly wears the bone conduction earphone, a method 1000 for feeding back the working state of the bone conduction earphone based on the vibration response feature of the earphone core may include the following operations.

In operation 1010, recognizing a difference between the vibration response feature of the earphone core and a target response feature.

In some embodiments, the operation 1010 may be performed by a determination module (e.g., the determination module 1420) of the bone conduction earphone. In some embodiments, the target response feature may be a preset vibration response feature of the earphone core of the bone conduction earphone. In some embodiments, the difference between an actual vibration response feature of the earphone core and the target response feature may be calculated by an algorithm. The difference may include but not limited to a difference of the resonance frequency, a difference of the response peak at a specific frequency, a difference of the quality factor, etc.

In operation 1020, performing, based on the difference, an EQ adjustment on the audio signal input to the earphone core.

In some embodiments, the operation 1020 may be performed by a control module (e.g., the control module 1430) of the bone conduction earphone. The EQ is an equalizer that may respectively adjust an amplification of various frequency component electrical signals. The EQ adjustment refers to dividing an audio signal into multiple frequency bands, and then adjusting (e.g., amplifying or attenuating) these frequency bands to obtain a better sound effect. In some embodiments, the control module may perform a compensation on the EQ based on the difference between the actual vibration response feature of the earphone core and the target response feature, the compensated EQ may act on the audio signal, and the EQ adjustment is performed on the original audio signal, and the earphone core may vibrate in response to the adjusted audio signal, so that the user may hear a more ideal sound through the bone conduction earphone.

Figure 11:
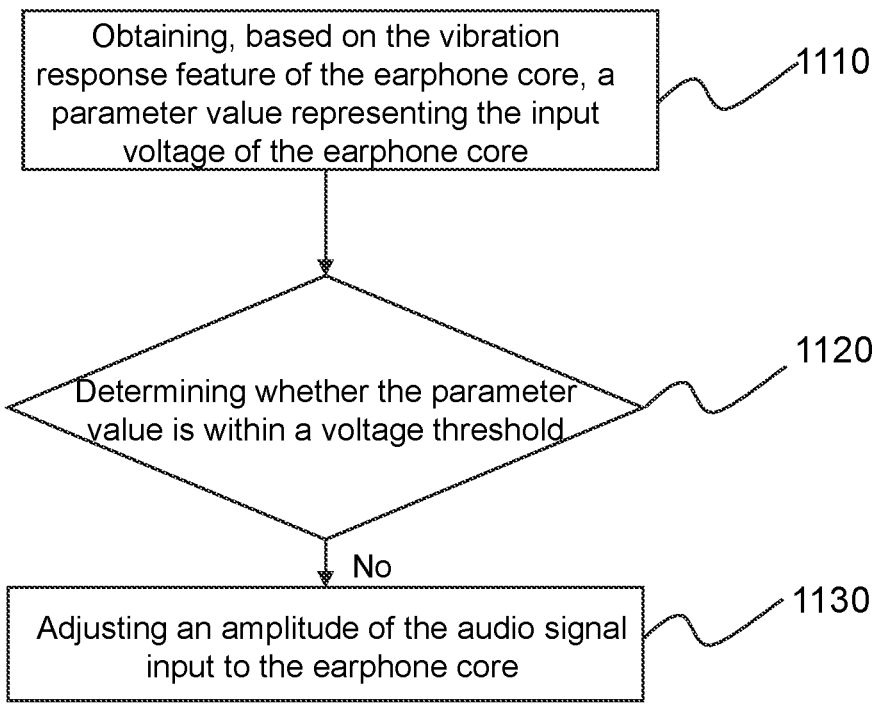
FIG. 11 is a flowchart illustrating the method for feeding back the working state of the bone conduction earphone according to some embodiments of the present disclosure.

In some embodiments, feeding back on the working state of the bone conduction earphone may include adjusting the amplitude of the audio signal input to the earphone core. Specifically, the amplitude of the bone conduction earphone is related to an input voltage of the earphone core. For example, the greater the input voltage of the earphone core is, the greater the amplitude of the earphone core is, and the smaller the input voltage of the earphone core is. The input voltage of the earphone core may affect the vibration amplitude of the earphone core. If the vibration amplitude of the earphone core is too great, it may bring discomfort to the user and even damage the user's hearing and the earphone core at the same time. If the vibration amplitude of the earphone core is too small, it may affect efficiency of the bone conduction, making the user hear the sound at a lower volume. FIG. 11 is a flowchart illustrating the method for feeding back the working state of the bone conduction earphone according to some embodiments of the present disclosure. When the working state of the bone conduction earphone is an input voltage of the earphone core, a method 1100 for feeding back the working state of the bone conduction earphone based on the vibration response feature of the earphone core may include the following operations.

In operation 1110, obtaining, based on the vibration response feature of the earphone core, a parameter value representing the input voltage of the earphone core. In some embodiments, the operation 1110 may be performed by a determination module (e.g., the determination module 1420) of the bone conduction earphone.

In some embodiments, as different input voltage of the earphone core may have an impact on a vibration amplitude of the earphone core, different input voltage of the earphone core may correspond to different vibration response feature of the earphone core, so the parameter value representing the input voltage of the earphone core may be obtained based on the vibration response feature of the earphone core, and then it may be determined whether the parameter value is within a voltage threshold. In some embodiments, the voltage threshold may be the maximum voltage that prevents the sound from the bone conduction earphone from being distorted or broken. For example, in some embodiments, the voltage threshold is the maximum voltage at which a sound pressure level of the sound emitted by the bone conduction earphone does not exceed a specific sound pressure level. In some embodiments, the specific sound pressure level may be in a range of 60 dB-100 dB. Preferably, the specific sound pressure level may be in the range of 70 dB-90 dB. Further preferably, the specific sound pressure level may be in the range of 75 dB-95 dB. In some embodiments, the parameter value representing the input voltage of the earphone core may be a specific input voltage or a range of the specific input voltage of the earphone core, or it may be the vibration amplitude of the earphone core or an overall output sound pressure of the earphone core. More contents on how to obtain the parameter value representing the input voltage of the earphone core based on the vibration response feature of the earphone core, please refer to the above method for obtaining the parameter value representing the clamping force when the user wears the bone conduction earphone, which is not repeated here. It should be noted that the voltage threshold and the specific sound pressure level may be adaptively adjusted according to actual application conditions and/or user experiences, which are not further limited here.

In operation 1120, determining whether the parameter value is within a voltage threshold.

In some embodiments, the operation 1120 may be performed by a determination module (e.g., the determination module 1420) of the bone conduction earphone. In some embodiments, the determination module may compare the parameter value with the voltage threshold to determine whether the parameter value is within the voltage threshold. In some embodiments, the voltage threshold may be an input voltage value or a range of the input voltage value of the earphone core that ensures user's comfortable wearing. In some embodiments, the voltage threshold may be an input voltage value or a range of the input voltage value of the earphone core that ensures that the earphone core may not be damaged. In some embodiments, the voltage threshold may be an input voltage value or a range of the input voltage value of the earphone core to protect the user's hearing. For example, when the parameter value is within the voltage threshold, the overall output of the earphone core may not exceed a certain sound pressure level (e.g., the overall sound pressure level may not exceed 85 dB for a children's earphone) to protect the user's hearing.

In operation 1130, in response to the determination that the parameter value is not within the voltage threshold, adjusting an amplitude of the audio signal input to the earphone core.

In some embodiments, the operation 1130 may be performed by a control module (e. g., the control module 1430) of the bone conduction earphone. In some embodiments, the bone conduction earphone may include a feedback circuit, and the control module may generate a corresponding instruction to control the feedback circuit to adjust the amplitude of the audio signal input to the earphone core in response to the parameter value not being within the voltage threshold. For example, the feedback circuit may limit the amplitude of the audio signal input to the earphone core, so as to limit the vibration amplitude of the earphone core, control a play volume of the bone conduction earphone, and avoid discomfort to the user and damage to the user's hearing and the damage to the earphone core caused by an excessive vibration amplitude of the earphone core. For another example, the feedback circuit may amplify the amplitude of the audio signal input to the earphone core, so as to increase the play volume of the bone conduction earphone and improve the sound quality.

Figure 12:
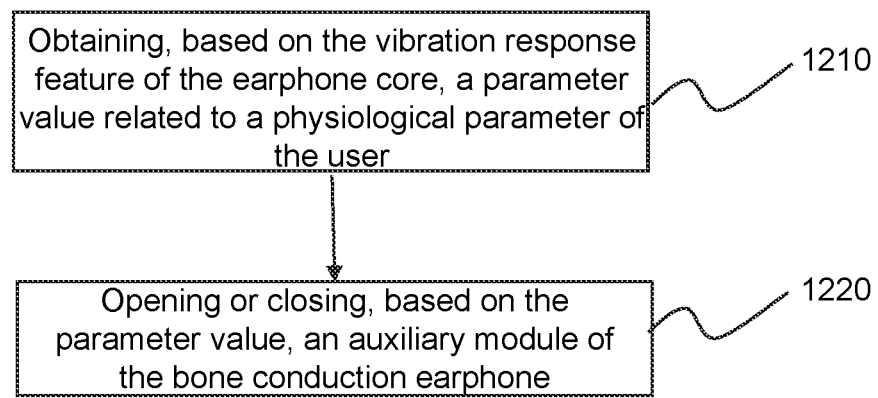
FIG. 12 is a flowchart illustrating the method for feeding back the working state of the bone conduction earphone according to some embodiments of the present disclosure.

In some embodiments, feeding back on the working state of the bone conduction earphone may include feeding back on a physiological state and the parameter of the user. Specifically, as the different vibration response feature of the earphone core may correspond to different mechanical impedance of the skin, the mechanical impedance of the skin may reflect the physiological state of the human body to a certain extent. By determining the vibration response feature of the earphone core when the user wears the bone conduction earphone, the corresponding skin mechanical impedance may be determined, and the user's physiological state may be determined based on the skin mechanical impedance. For example, it may be determined whether the user is an elderly person and whether the user is fat or thin. FIG. 12 is a flowchart illustrating the method for feeding back the working state of the bone conduction earphone according to some embodiments of the present disclosure. When the bone conduction earphone is used to feedback the user's physiological state and the parameter, a method for feeding back the working state of the bone conduction earphone 1200 based on the vibration response feature of the earphone core may include the following operations.

In operation 1210, obtaining, based on the vibration response feature of the earphone core, a parameter value related to a physiological parameter of the user.

In some embodiments, the operation 1210 may be performed by a determination module (e.g., the determination module 1420) of the bone conduction earphone. In some embodiments, the user's physiological parameter refers to a mechanical impedance parameter of the skin in contact with the earphone core. The parameter value related to the user's physiological parameter may include quality, elasticity, damping, etc. of the mechanical impedance of the skin in contact with the earphone core, and the parameter value may reflect the user's fatness, age, etc. For contents on how to obtain the parameter value related to the user's physiological parameter based on the vibration response feature of the earphone core, please refer to the above method for obtaining the parameter value representing the clamping force when the user wears the bone conduction earphone, which is be repeated here.

In operation 1220, opening or closing, based on the parameter value, an auxiliary module of the bone conduction earphone.

In some embodiments, the operation 1220 may be performed by a control module (e.g., the control module 1430) of the bone conduction earphone. In some embodiments, the control module may determine change of the user's physiological state according to an obvious change of the parameter value during a short period of time, and then open the corresponding auxiliary module based on the change of the user's physiological state. The auxiliary module may prompt the user to pay attention to the change of the physiological state. For example, the control module may determine that the user is getting fat or thin according to the changes in the elasticity and the damping of the skin mechanical impedance, and prompt the user to pay attention through the auxiliary module. In some embodiments, the control module may determine that the user is an elderly person or a young person according to the parameter value. If the user is an elderly person, the auxiliary module may be turned on to enable the auxiliary module to perform some humanized functions. The humanized functions may include but are not limited to falling detection, voice reminder, automatic gain control, etc. For example, the fall detection of the auxiliary module may predict falling of the elderly person and issue a voice reminder to the elderly person, or actively call for help or notify an emergency contact after detecting the falling of the elderly. For another example, the automatic gain control of the auxiliary module may automatically adjust the vibration amplitude of the earphone core for the elderly person, so as to prevent the elderly person from the wearing discomfort caused by the excessive vibration amplitude of the earphone core.

It should be noted that the method for optimizing the working state of the bone conduction earphone provided in the present disclosure may include the above single method for feeding back the working state of the bone conduction earphone to achieve a single function, or may include the above multiple methods for feeding back on the working of the bone conduction earphone, so as to implement multiple functions simultaneously. The functions realized by the method of feeding back on the working state of the bone conduction earphone may include adjusting a power consumption of the bone conduction earphone, prompting the user to wear the bone conduction earphone again, adjusting a clamping force when the user wears the bone conduction earphone, performing an EQ adjustment on the audio signal, adjusting an amplitude of the audio signal, and monitoring the user's physiological state, the like, or any combination thereof. The order of feeding back on the various working states of the bone conduction earphone may be adaptively adjusted according to an actual condition. For example, in some embodiments, the detection and feedback on whether the bone conduction earphone is in the wearing state may be performed first, and then the detection and feedback on one or more of whether the wearing state is a user well-wearing state, a magnitude of the clamping force, and the voltage may be performed. For another example, multiple working states of the bone conduction earphone may be determined at the same time. In addition, the detection and feedback of the working state of the bone conduction earphone may be a real-time detection, a detection at intervals (e.g., 3 s, 2 min, etc.), or the detection based on a user input instruction.

In some embodiments, the method for optimizing the working state of the bone conduction earphone in the present disclosure further includes performing some additional functions through the vibration sensor. The additional functions may include, but are not limited to, echo cancellation, picking up the user's voice signal, falling detection, assisting in the realization of spatial audio, etc.

In some embodiments, the vibration sensor may be used for the echo cancellation. Specifically, the vibration sensor may pick up the vibration of the earphone core as a microphone, feed back the vibration to the earphone core for cancellation, and prevent the sound emitted by the earphone core from being transmitted to the earphone core, causing echo or howling. At this time, the position of the vibration sensor may be selected to be close to the earphone core, so as to directly pick up the vibration near the earphone core to cancel.

In some embodiments, a vibration sensor may be used to pick up the user's voice signal. Specifically, as the earphone core is attached to the skin and skull, when the user wears the bone conduction earphone to speak, the sound may further be reversely transmitted to the earphone core through the skull. At this time, through the vibration of the earphone core, the voice of the user may further be picked up. Picking up the user's voice signal by vibration through the vibration sensor may resist an external air conduction noise. Compared with a traditional air conduction microphone, the picking up the user's voice signal by vibration is basically free from an external noise interference.

In some embodiments, the vibration sensor may be used for the falling detection. In some embodiments, the vibration sensor may be a one-axis vibration sensor, a multi-axis vibration sensor such as a three-axis vibration sensor, etc. In some embodiments, the vibration sensor may also be a rotational angular speed type vibration sensor. In some embodiments, the vibration sensor may sense a drastic acceleration change when the user falls or tends to fall, so as to predict that the user, especially the elderly person, may fall. Furthermore, the bone conduction earphone may make a corresponding warning based on the falling detection of the vibration sensor, or notify the emergency contact.

In some embodiments, the vibration sensor may further be used to assist in the realization of the spatial audio. Specifically, to realize the spatial audio, first a rotation direction of the user's head needs to be determined by a gyroscope, and the vibration sensor may include the gyroscope. In some embodiments, the vibration sensor may be multi-axis translational or rotational vibration sensors.

It should be noted that the above additional function may be performed by one vibration sensor, or may be performed by multiple vibration sensors respectively. In some embodiments, the vibration sensor may further work together with other sensors. For example, the vibration sensor may be combined with a physiological sensor to jointly detect the physiological state of the user when the user wears the bone conduction earphone.

Figure 13:
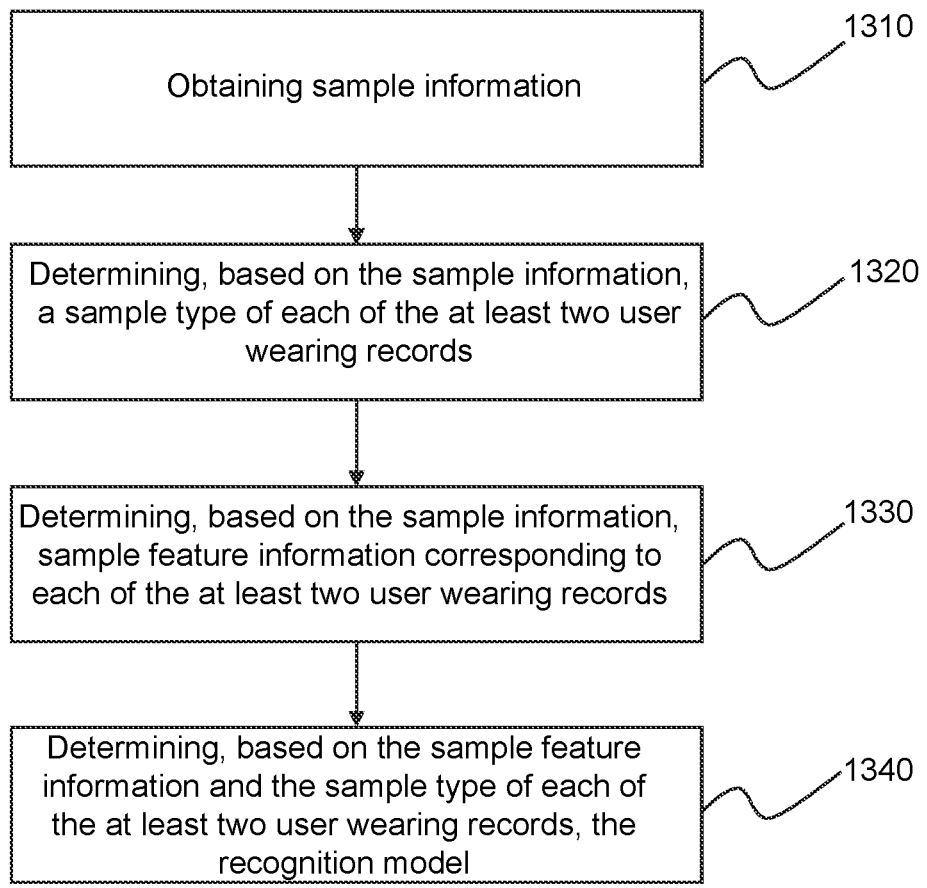
FIG. 13 is a flowchart illustrating a method for training a recognition model according to some embodiments of the present disclosure.

The present disclosure further provides a training method for the recognition model. FIG. 13 is a flowchart illustrating a training method for a recognition model according to some embodiments of the present disclosure. As shown in FIG. 13, a training method 1300 of the recognition model may include the following operations.

In operation 1310, obtaining sample information.

In some embodiments, the sample information may include user wearing records of at least two users. The user wearing records may include the working states of the bone conduction earphones, the frequency response curves of the vibration of the corresponding earphone cores, the clamping force when the user wears the bone conduction earphone, and the frequency response curve of the vibration of the corresponding earphone core, the input voltage of the earphone core, and the frequency response curve of the vibration of the corresponding earphone core, etc.

In 1320, determining, based on the sample information, a sample type of each of the at least two user wearing records, the sample type including a positive sample type or a negative sample type.

In some embodiments, the working state of the bone conduction earphone being the user wearing state may be determined as a positive sample type, and the working state of the bone conduction earphone being the user not wearing state may be determined as a negative sample type. In some embodiments, the working state of the bone conduction earphone being the user well-wearing state may be determined as a positive sample type, and the working state of the bone conduction earphone being the user not well-wearing state may be determined as a negative sample type.

In 1330, determining, based on the sample information, sample feature information corresponding to each of the at least two user wearing records.

In some embodiments, the sample feature information may include the vibration response feature of the earphone core and the working state of the bone conduction earphone. In some embodiments, the vibration response feature of the earphone core may include, but not limited to, one or more of the resonant frequency of the earphone core, the response peak at a specific frequency, the quality factor, and the input voltage. In some embodiments, the working state of the bone conduction earphone may include the user wearing state/the user not wearing state, the user well-wearing state/the user not well-wearing state, the clamping force when the user wears the bone conduction earphone, the input voltage of the earphone core, etc. In some embodiments, the vibration response feature may be directly extracted from the sample information corresponding to the user wearing records. In some embodiments, the working state of the bone conduction earphone may be determined based on the vibration response feature. For details on the determining the working state of the bone conduction earphone based on the vibration response feature, please refer to FIGS. 1-11 and the related descriptions of the present disclosure.

In operation 1340, determining, based on the sample feature information and the sample type of each of the at least two user wearing records, the recognition model.

In some embodiments, the sample feature information may be used as an input, and each sample type of the at least two user wearing records may be used as an output to train an initial machine learning model to determine the recognition model. In some embodiments, the recognition model may include at least one of a naive Bayesian model, a linear regression model, a decision tree model, or a support vector machine model.

Figure 14:
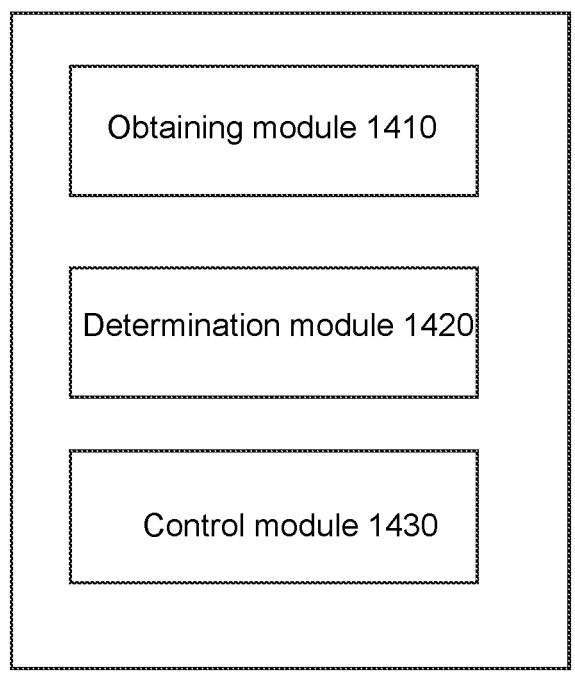
FIG. 14 is a block diagram illustrating a bone conduction earphone according to some embodiments of the present disclosure.

The embodiment of the present disclosure further provides a bone conduction earphone. FIG. 14 is a block diagram illustrating a bone conduction earphone according to some embodiments of the present disclosure. A bone conduction earphone 1000 may include an obtaining module 1410, a determination module 1420, and a control module 1430.

In some embodiments, the obtaining module 1410 may be configured to obtain an audio signal and a vibration signal. Further, the obtaining module 1410 may include an earphone core and at least one vibration sensor, and the obtaining module 1410 may obtain the data from an internal storage unit of the bone conduction earphone or a terminal device (such as a mobile phone, a computer, an MP3, etc.) wired or wirelessly connected to the bone conduction earphone to obtain the audio signal. The earphone core may generate a vibration in response to the audio signal, and the obtaining module 1410 may obtain the vibration signal based on the vibration of the earphone core through the at least one vibration sensor.

In some embodiments, the determination module 1420 may determine a vibration response feature of the earphone core based on the audio signal and the vibration signal. In some embodiments, the vibration response feature of the earphone core may include at least one of a resonant frequency of the earphone core, a response peak of a specific frequency, a quality factor, and an input voltage. In some embodiments, when the working state of the bone conduction earphone includes a user wearing state and a user not wearing state, the determination module 1420 may determine whether the working state of the bone conduction earphone is the user not wearing state based on the vibration response feature of the earphone core. In some embodiments, when the working state of the bone conduction earphone includes a user well-wearing state and a user not well-wearing state, the determination module 1420 may determine whether the working state of the bone conduction earphone is the user not well-wearing state based on the vibration response feature of the earphone core. In some embodiments, when the working state of the bone conduction earphone is related to a clamping force when the user wears the bone conduction earphone, the determination module 1420 may be configured to determine whether the clamping force when the user wears the bone conduction earphone is within a preset range. In some embodiments, the determination module 1420 may be configured to recognize a difference between the vibration response feature of the earphone core and a target response feature. In some embodiments, when the working state of the bone conduction earphone includes the input voltage, the determination module 1420 may be configured to obtain the parameter value representing the input voltage of the earphone core based on the vibration response feature of the earphone core, and determine whether the parameter value is within a voltage threshold. In some embodiments, the determination module 1420 may be used to obtain a parameter value related to the user's physiological parameter based on the vibration response feature of the earphone core.

In some embodiments, the control module 1430 may be configured to feedback on the working state of the bone conduction earphone based on the vibration response feature of the earphone core. In some embodiments, when the working state of the bone conduction earphone is the user not wearing state, the control module 1430 may be configured to generate an instruction to adjust a power consumption of the bone conduction earphone. In some embodiments, when the working state of the bone conduction earphone is the user not well-wearing state, the control module 1430 may be configured to control the bone conduction earphone to issue a prompt message. In some embodiments, when the clamping force when the user wears the bone conduction earphone is not within the preset range, the control module 1430 may be configured to generate an instruction to adjust a corresponding structure of the bone conduction earphone, so as to change the clamping force when the user wears the bone conduction earphone. In some embodiments, the control module 1430 may be configured to adjust the EQ of the audio signal input to the earphone core according to the difference between the vibration response feature of the earphone core and the target vibration response feature. In some embodiments, when the parameter value representing the input voltage of the earphone core is not within the voltage threshold, the control module 1430 may be configured to adjust the amplitude of the audio signal input to the earphone core. In some embodiments, the control module 1430 may be configured to open or close an auxiliary module of the bone conduction earphone.

It should be noted that the above description of the modules included in the bone conduction earphone is only for illustrating the modules related to optimizing the working state of the bone conduction earphone. In some embodiments, the bone conduction earphone 1400 may further include other modules, for example, a training module for training the recognition model, a signal processing module for processing the audio signal or the vibration signal, a power supply module for powering the bone conduction earphone, etc. The other modules of the bone conduction earphone will not be repeated here.

It should be noted that the above description of the modules included in the bone conduction earphone is only for the convenience of description, and does not limit the present disclosure to the scope of the illustrated embodiments. It should be understood that for those skilled in the art, after understanding the principle of the bone conduction earphone, various modules may be arbitrarily combined, or may form a subsystem to connect to other modules without departing from the principle. In some embodiments, the obtaining module 1410, the determination module 1420, and the control module 1430 disclosed in FIG. 14 may be different modules in the bone conduction earphone, or one module may implement the functions of the above two or more modules. For example, each module may share a storage module, and each module may also have its own storage module. Such deformations are within the protection scope of the present disclosure.

The basic concept has been described above, obviously, for those skilled in the art, the above detailed disclosure is only an example, and does not constitute a limitation to the present disclosure. Although not expressly stated here, various modifications, improvements and amendments to the present disclosure may be made by those skilled in the art. Such modifications, improvements, and amendments are suggested in the present disclosure, so they still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "an embodiment" or "one embodiment" or "an alternative embodiment" in different places in the present disclosure do not necessarily refer to the same embodiment. In addition, certain features, structures or characteristics of one or more embodiments of the present disclosure may be properly combined.

In addition, those skilled in the art may understand that various aspects of the present disclosure may be illustrated and described through several patentable categories or situations, including any new and useful processes, machines, products, or combinations of materials, or any new and useful improvements. Accordingly, all aspects of the present disclosure may be performed entirely by hardware, may be performed entirely by software (including firmware, resident software, microcode, etc.), or may be performed by a combination of hardware and software. The above hardware or software may be referred to as "data block", "module", "engine", "unit", "component" or "system". Additionally, aspects of the present disclosure may be embodied as a computer product comprising computer readable program code on one or more computer readable media.

A computer storage medium may contain a propagated data signal with the computer program code embodied therein, for example, on baseband or as part of a carrier wave. The propagating signal may take a variety of manifestations, including electromagnetic, optical, etc., or a suitable combination. A computer storage medium may be any computer-readable medium, other than a computer-readable storage medium, that can be used to communicate, propagate, or transfer a program for use by being coupled to an instruction execution system, apparatus, or device. The program coding located on the computer storage medium can be transmitted through any appropriate media, including radio, cables, fiber cables, RF, or similar media, or any combination of the above media.

The computer program codes required for the operation of each part of the present disclosure can be written in any one or more programming languages, including object-oriented programming languages such as Java, Scala, Smalltalk, Eiffel, JADE, Emerald, C++, C#, VB.NET, Python etc., conventional procedural programming languages such as C language, Visual Basic, Fortran 2003, Perl, COBOL 2002, PHP, ABAP, dynamic programming languages such as Python, Ruby and Groovy, or other programming languages, etc. The program code may run entirely on the user's computer, or as a stand-alone software package, or run partly on the user's computer and partly on a remote computer, or entirely on the remote computer or server. In the latter case, the remote computer can be connected to the user computer through any form of network, such as a local area network (LAN) or wide area network (WAN), or to an external computer (such as through the Internet), or in a cloud computing environment, or as a service use software as a service (SaaS).

In addition, unless explicitly stated in the claims, the order of processing elements and sequences described in the present disclosure, the use of numbers and letters, or the use of other designations are not used to limit the order of the processes and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, rather, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, the disclosure does not mean that the present disclosure requires more features than the features mentioned in the claims. Rather, the claimed subject matter may lie in less than all features of a single foregoing disclosed embodiment.

In some embodiments, numbers describing the quantity of components and attributes are used. It should be understood that such numbers used in the description of the embodiments use the modifiers "about", "approximately" or "substantially" in some examples to retouch. Unless otherwise stated, the "about", "approximately" or "substantially" indicates that the stated figure allows for a variation of ±20%. Accordingly, in some embodiments, the numerical parameters used in the present disclosure and claims are approximations that can vary depending upon the desired features of individual embodiments. In some embodiments, numerical parameters should take into account the specified significant digits and adopt the general digit reservation method. Although the numerical ranges and parameters used in some embodiments of the present disclosure to confirm the breadth of the scope are approximate values, in specific embodiments, such numerical values are set as precisely as practicable.

The entire contents of each patent, patent application, patent application publication, and other material, such as articles, books, disclosures, publications, documents, etc., cited in the present disclosure are hereby incorporated by reference into the present disclosure. Application history documents that are inconsistent with or conflict with the content of the present disclosure are excluded, as are documents (currently or hereafter appended to this disclosure) that limit the broadest scope of the claims of the present disclosure. It should be noted that if there is any inconsistency or conflict between the descriptions, definitions, and/or terms used in the attached materials of the present disclosure and the contents of the present disclosure, the descriptions, definitions and/or terms used in the present disclosure shall prevail.

Finally, it should be understood that the embodiments described in the present disclosure are only used to illustrate the principles of the embodiments of the present disclosure. Other modifications are also possible within the scope of the present disclosure. Therefore, by way of example and not limitation, alternative configurations of the embodiments of the present disclosure may be considered consistent with the teachings of the present disclosure. Accordingly, the embodiments of the present disclosure are not limited to the embodiments explicitly introduced and described in the present disclosure.

What is claimed is:

1. A method for optimizing a working state of a bone conduction earphone, wherein the bone conduction earphone includes an earphone core and at least one vibration sensor, and the method comprises:

obtaining, by the at least one vibration sensor, a vibration signal, the vibration signal being at least partially derived from vibration generated by the earphone core in response to an audio signal, and the vibration of the earphone core being transmitted to a user wearing the bone conduction earphone through bone conduction;

determining, based on the vibration signal and the audio signal, a vibration response feature of the earphone core; and feeding back, based on the vibration response feature of the earphone core, a working state of the bone conduction earphone.

2. The method of claim 1, wherein the vibration response feature includes at least one of a resonance frequency of the earphone core, a response peak at a specific frequency, a quality factor, and an input voltage.

3. The method of claim 1, wherein the working state of the bone conduction earphone includes a user wearing state and a user not wearing state, and the feeding back, based on the vibration response feature of the earphone core, a working state of the bone conduction earphone comprises:
  determining, based on the vibration response feature of the earphone core, whether the working state is the user not wearing state; and
  generating, in response to a determination that the working state is the user not wearing state, an instruction to adjust a power consumption of the bone conduction earphone.

4. The method of claim 3, wherein the determining, based on the vibration response feature of the earphone core, whether the working state is the user not wearing state comprises:
  inputting the vibration response feature of the earphone core to a recognition model; and
  generating, based on an output of the recognition model, a determination result.

5. The method of claim 1, wherein the working state of the bone conduction earphone includes a user well-wearing state and a user not well-wearing state, and the feeding back, based on the vibration response feature of the earphone core, a working state of the bone conduction earphone comprises:
  determining, based on the vibration response feature of the earphone core, whether the working state is the user not well-wearing state; and
  issuing, in response to a determination that the working state is the user not well-wearing state, a prompt message by the bone conduction earphone.

6. The method of claim 5, wherein the determining, based on the vibration response feature of the earphone core, whether the working state is the user not well-wearing state comprises:
  inputting the vibration response feature of the earphone core to a recognition model; and
  generating, based on an output of the recognition model, a determination result.

7. The method of claim 1, wherein the working state of the bone conduction earphone is related to a clamping force when the user wears the bone conduction earphone, and the feeding back, based on the vibration response feature of the earphone core, a working state of the bone conduction earphone comprises:
  determining, based on the vibration response feature of the earphone core, whether the clamping force when the user wears the bone conduction earphone is within a preset range; and
  generating, in response to a determination that the clamping force is not within the preset range, an instruction to adjust a corresponding structure of the bone conduction earphone, so as to change the clamping force when the user wears the bone conduction earphone.

8. The method of claim 7, wherein the determining, based on the vibration response feature of the earphone core, whether the clamping force when the user wears the bone conduction earphone is within a preset range comprises:
  inputting the vibration response feature of the earphone core to a recognition model;
  obtaining, based on an output of the recognition model, a parameter value representing the clamping force when the user wears the bone conduction earphone; and
  determining whether the parameter value is within the preset range.

9. The method of claim 1, wherein the working state of the bone conduction earphone includes an input voltage of the earphone core, and the feeding back, based on the vibration response feature of the earphone core, a working state of the bone conduction earphone comprises:
  obtaining, based on the vibration response feature of the earphone core, a parameter value representing the input voltage of the earphone core;
  determining whether the parameter value is within a voltage threshold; and
  adjusting, in response to the determination that the parameter value is not within the voltage threshold, an amplitude of the audio signal input to the earphone core.

10. The method of claim 1, wherein the feeding back, based on the vibration response feature of the earphone core, a working state of the bone conduction earphone comprises:
  obtaining, based on the vibration response feature of the earphone core, a parameter value related to a physiological parameter of the user; and
  opening or closing, based on the parameter value, an auxiliary module of the bone conduction earphone.

11. The method of claim 1, wherein the vibration signal is obtained after the earphone core is coupled with skin of a human body; and the determining, based on the vibration signal and the audio signal, a vibration response feature of the earphone core includes:
  determining, based on the vibration signal and the audio signal, a frequency response curve of the vibration of the earphone core; and
  determining, based on the frequency response curve of the vibration of the earphone core, the vibration response feature of the earphone core.

12. A bone conduction earphone, including an obtaining module, a determination module, and a control module, wherein
  the obtaining module is configured to obtain a vibration signal through at least one vibration sensor, the vibration signal being at least partially derived from vibration generated by the earphone core in response to an audio signal, and the vibration of the earphone core being transmitted to a user wearing the bone conduction earphone through bone conduction;
  the determination module is configured to determine, based on the vibration signal and the audio signal, a vibration response feature of the earphone core; and
  the control module is configured to feed back, based on the vibration response feature of the earphone core, a working state of the bone conduction earphone.

13. The bone conduction earphone of claim 12, wherein the vibration response feature includes at least one of a resonance frequency of the earphone core, a response peak at a specific frequency, a quality factor, and an input voltage.

14. The bone conduction earphone according to claim 12, wherein the working state of the bone conduction earphone includes a user wearing state and a user not wearing state, and to feed back, based on the vibration response feature of the earphone core, a working state of the bone conduction earphone,
  the determination module is configured to determine, based on the vibration response feature of the earphone core, whether the working state is the user not wearing state; and
  the control module is configured to generate, in response to the determination that the working state is the user not wearing state, an instruction to adjust a power consumption of the bone conduction earphone.

15. The bone conduction earphone according to claim 12, wherein the working state of the bone conduction earphone includes a user well-wearing state and a user not well-wearing state, and to feed back, based on the vibration response feature of the earphone core, a working state of the bone conduction earphone, the determination module is configured to determine, based on the vibration response feature of the earphone core, whether the working state is the user not well-wearing state; and the control module is configured to control the bone conduction earphone issue, in response to the determination that the working state is the user not well-wearing state, a prompt message.

16. The bone conduction earphone of claim 12, wherein the working state of the bone conduction earphone is related to a clamping force when the user wears the bone conduction earphone, and to feed back, based on the vibration response feature of the earphone core, a working state of the bone conduction earphone, the determination module is configured to determine, based on the vibration response feature of the earphone core, whether the clamping force when the user wears the bone conduction earphone is within a preset range; and the control module is configured to generate, in response to the determination that the clamping force is not within the preset range, an instruction to adjust a corresponding structure of the bone conduction earphone, so as to change the clamping force when the user wears the bone conduction earphone.

17. The bone conduction earphone of claim 16, wherein to determine, based on the vibration response feature of the earphone core, whether the clamping force when the user wears the bone conduction earphone is within a preset range, the obtaining module is configured to input the vibration response feature of the earphone core to a recognition model;

the obtaining module is configured to obtain, based on an output of the recognition model, a parameter value representing the clamping force when the user wears the bone conduction earphone; and the determination module is configured to determine whether the parameter value is within the preset range.

18. The bone conduction earphone of claim 12, wherein to feed back, based on the vibration response feature of the earphone core, a working state of the bone conduction earphone, the determination module is configured to recognize a difference between the vibration response feature of the earphone core and a target vibration response feature; and the control module is configured to perform, based on the difference, an EQ adjustment on the audio signal input to the earphone core.

19. The bone conduction earphone of claim 12, wherein the working state of the bone conduction earphone includes an input voltage of the earphone core, and to feed back, based on the vibration response feature of the earphone core, a working state of the bone conduction earphone, the obtaining module is configured to obtain, based on the vibration response feature of the earphone core, a parameter value representing the input voltage of the earphone core;

the determination module is configured to determine whether the parameter value is within a voltage threshold;

the control module is configured to adjust, in response to the determination that the parameter value is not within the voltage threshold, an amplitude of the audio signal input to the earphone core.

20. The bone conduction earphone of claim 12, wherein to feed back, based on the vibration response feature of the earphone core, a working state of the bone conduction earphone, the obtaining module is configured to obtain, based on the vibration response feature of the earphone core, a parameter value related to a physiological parameter of the user; and the control module is configured to open or close, based on the parameter value, an auxiliary module of the bone conduction earphone.

* * * * *